United States Patent
Oka et al.

(10) Patent No.: US 6,485,885 B1
(45) Date of Patent: Nov. 26, 2002

(54) PHOTOPOLYMERIZABLE THERMOSETTING RESIN COMPOSITIONS

(75) Inventors: Hidetaka Oka, Amagasaki (JP); Masaki Ohwa, Kobe (JP); Akira Matsumoto, Amagaski (JP); Hisatoshi Kura, Takarazuka (JP)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 0 days.

(21) Appl. No.: 09/720,441

(22) PCT Filed: Jun. 18, 1999

(86) PCT No.: PCT/EP99/04234

§ 371 (c)(1), (2), (4) Date: Dec. 22, 2000

(87) PCT Pub. No.: WO00/00869

PCT Pub. Date: Jan. 6, 2000

(30) Foreign Application Priority Data

Jun. 26, 1998 (EP) .............................................. 98810596

(51) Int. Cl.⁷ ......................... G03F 7/004; G03F 7/038
(52) U.S. Cl. .................... 430/270.1; 430/325; 430/330; 430/280.1; 522/100
(58) Field of Search ............................. 430/270.1, 325, 430/330, 280.1; 522/100

(56) References Cited

U.S. PATENT DOCUMENTS

| | | | |
|---|---|---|---|
| 5,658,712 A | * | 8/1997 | Steinmann et al. ......... 430/325 |
| 5,741,622 A | * | 4/1998 | Arima ...................... 430/270.1 |
| 6,156,462 A | * | 12/2000 | Yanagawa et al. ............ 430/18 |
| 6,238,840 B1 | * | 5/2001 | Hirayama et al. ....... 430/280.1 |
| 6,432,612 B1 | * | 8/2002 | Hamada et al. .......... 430/280.1 |

OTHER PUBLICATIONS

Chem. Abstr. vol. 115, No. 20, Abstr. No. 218887, (1991) for JP 03004226.

Derwent Abstr. 97–003129 for JP 08272095 (1996).

* cited by examiner

Primary Examiner—Rosemary Ashton
(74) Attorney, Agent, or Firm—Tyler A. Stevenson

(57) ABSTRACT

Compositions comprising (A) an oligomer or polymer containing at least one carboxylic acid group in the molecule; (B) at least one compound of formulas (I, II, III, IV, V or VI), wherein $R_1$ inter alia is phenyl or alkyl; $R_2$ is for example $C_2$–$C_{12}$alkonoyl which is unsubstituted or substituted or is benzoyl; $R_3$, $R_4$, $R_5$, $R_6$ and $R_7$ independently of one another are for instance hydrogen, $C_1$–$C_{12}$alkyl, cyclohexyl or phenyl which is unsubstituted or substituted, or are benzyl, benzoyl, $C_2$–$C_{12}$alkanoyl or phenoxycarbonyl; $R_8$ is for example hydrogen or $C_1$–$C_{12}$alkyl or a group (B); M is for example $C_1$–$C_{12}$alkylene, cyclohexylene or phenylene; $M_1$ inter alia is a direct bond or $C_1$–$C_{12}$alkylenoxy; and Ar is a 5- or 6-membered aromatic heterocyclic ring; (C) a photopolymerizable reactive or unreactive diluent; and (D) as a thermosetting component an epoxy compound containing at least two epoxy groups in one molecule; are highly suitable as resists which are alkaline developable.

12 Claims, No Drawings

PHOTOPOLYMERIZABLE THERMOSETTING RESIN COMPOSITIONS

The invention pertains to compositions comprising O-acyloxime photoinitiators and the use of these compositions especially in imaging technique.

From U.S. Pat. Nos. 3,558,309, 4,202,697, 4,255,513, 4,590,145 it is known that oxime ester derivatives are photoinitiators. In JP Kokai Hei 8-272095 solder resist ink compositions comprising inter alia 1-phenyl-1,2-propanedione-2-O-benzoyl oxime and 1-phenyl-1,2-propanedione-2-O-ethoxycarbonyl oxime as photoinitiators are disclosed. In JP Kokai Hei 8-339081 in a similar composition 1-phenyl-1,2-propanedione-2-O-ethoxycarbonyl oxime is employed.

In photopolymerization technology there still exists a need for compositions suitable in particular as imaging formulations which are reactive, alkaline developable, easy to handle, exhibit good resolution properties and meet the high requirements of the industry regarding properties like, for example, thermal stability and storage stability.

Surprisingly it was found, that photosensitive thermosetting liquid compositions comprising (A) an oligomer or polymer containing at least one carboxylic acid group in the molecule;

(B) at least one compound of the formula I, II, III, IV, V or VI

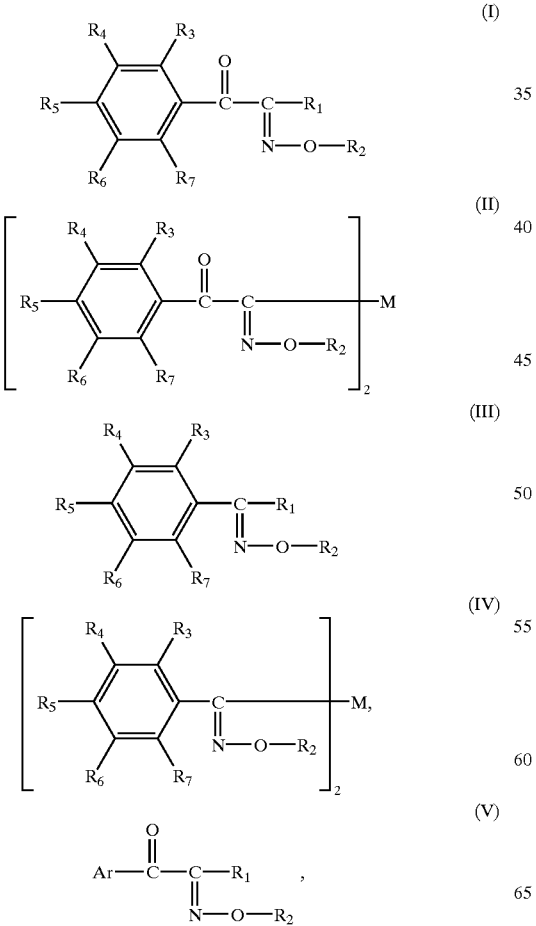

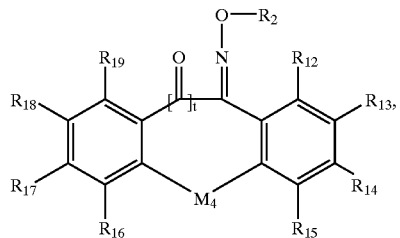

wherein $R_1$ is phenyl which is unsubstituted or substituted by one or more $C_1$–$C_6$alkyl, phenyl, halogen, $OR_8$, $SR_9$ or $NR_{10}R_{11}$, or $R_1$ is $C_1$–$C_{20}$alkyl, $C_2$–$C_{20}$alkenyl, $C_2$–$C_{20}$alkynyl or $C_2$–$C_{20}$-alkyl optionally interrupted by one or more —O— and/or optionally substituted by one or more hydroxyl groups, or $R_1$ is $C_2$–$C_{20}$alkanoyl or benzoyl which is unsubstituted or substituted by one or more $C_1$–$C_6$alkyl, phenyl, $OR_8$, $SR_9$ or $NR_{10}R_{11}$, or $R_1$ is $C_2$–$C_{12}$alkoxycarbonyl optionally interrupted by one or more —O— and/or optionally substituted by one or more hydroxyl groups, or $R_1$ is phenoxycarbonyl which is unsubstituted or substituted by $C_1$–$C_6$alkyl, halogen, phenyl, $OR_8$ or $NR_{10}R_{11}$, or $R_1$ is —$CONR_{10}R_{11}$, CN, $NO_2$, $C_1$–$C_4$-haloalkyl, $S(O)_mC_1$–$C_6$alkyl, unsubstituted or $C_1$–$C_{12}$alkyl-substituted $S(O)_m$—$C_6$–$C_{12}$aryl, $SO_2O$—$C_1$–$C_6$alkyl, $SO_2O$—$C_6$–$C_{10}$aryl, or diphenylphosphinoyl, or $R_1$ together with $R_3$ or $R_1$ together with $R_7$ may form 5 or 6 membered rings including one or more CO— and/or oxime-groups;

m is 1 or 2;

$R_2$ is $C_2$–$C_{12}$alkanoyl which is unsubstituted or substituted by one or more halogen or CN, or $R_2$ is $C_3$–$C_{12}$alkenoyl, or benzoyl which is unsubstituted or substituted by one or more $C_1$–$C_6$alkyl, phenyl, halogen CN, $OR_8$, $SR_9$ or $NR_{10}R_{11}$, or $R_2$ is $C_2$–$C_{12}$alkoxycarbonyl or phenoxycarbonyl which is unsubstituted or substituted by $C_1$–$C_6$alkyl or halogen;

$R_3$, $R_4$, $R_5$, $R_6$ and $R_7$ independently of one another are hydrogen, halogen, $C_1$–$C_{12}$alkyl, cyclopentyl, cyclohexyl or phenyl which is unsubstituted or substituted by one or more $OR_8$, $SR_9$ or $NR_{10}R_{11}$, or $R_3$, $R_4$, $R_5$, $R_6$ and $R_7$ are benzyl, benzoyl, $C_2$–$C_{12}$alkanoyl, $C_2$–$C_{12}$alkoxycarbonyl optionally interrupted by one or more —O— and/or optionally substituted by one or more hydroxyl groups or $R_3$, $R_4$, $R_5$, $R_6$ and $R_7$ are phenoxycarbonyl or a group $OR_8$, $SR_9$, $SOR_9$, $SO_2R_9$, $NO_2$, CN, $CONR_{10}R_{11}$, or $NR_{10}R_{11}$, wherein the substituents $OR_8$, $SR_9$ and $NR_{10}R_{11}$ may form 5- or 6-membered rings via the radicals $R_8$, $R_9$, $R_{10}$ and/or $R_{11}$ with further substituents on the phenyl ring or with one of the carbon atoms of the phenyl ring;

$R_8$ is hydrogen, $C_1$–$C_{12}$alkyl or $C_2$–$C_6$alkyl which is substituted by —OH, —SH, —CN, $C_1$–$C_4$alkoxy, $C_3$–$C_6$alkenoxy, —$OCH_2CH_2CN$, —$OCH_2CH_2COO(C_1$–$C_4$alkyl), —$OCO$—$C_1$–$C_4$alkyl, —$OCO$-phenyl, COOH or COO($C_1$–$C_4$alkyl), or $R_8$ is $C_2$–$C_6$alkyl which is interrupted by one or more —O—, or $R_8$ is —$(CH_2CH_2O)_nH$, $C_2$–$C_8$alkanoyl, $C_2$–$C_{12}$alkenyl, $C_3$–$C_6$alkenoyl, cyclohexl or phenyl which is unsubstituted or substituted by halogen, $C_1$–$C_{12}$alkyl or $C_1$–$C_4$alkoxy, or $R_8$ is phenyl-$C_1$–$C_3$alkyl or $Si(C_1$–$C_8alkyl)_r(phenyl)_{3-r}$ or $R_8$ is a group

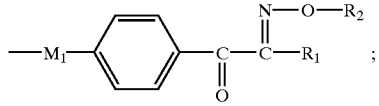

n is 1–20;
r is 1, 2 or 3;
$R_9$ is hydrogen, $C_1$–$C_{12}$alkyl, $C_2$–$C_{12}$alkenyl, cyclohexyl, $C_2$–$C_6$alkyl which is substituted by —OH, —SH, —CN, $C_1$–$C_4$alkoxy, $C_3$–$C_6$alkenoxy, —OCH$_2$CH$_2$CN, —OCH$_2$CH$_2$COO($C_1$–$C_4$alkyl), —OCO—$C_1$–$C_4$alkyl, —OCO-phenyl, COOH or COO($C_1$–$C_4$alkyl) or $R_9$ is $C_2$–$C_{12}$alkyl which is interrupted by one or more —O— or —S— or $R_9$ is phenyl which is unsubstituted or substituted by halogen, $C_1$–$C_{12}$alkyl or $C_1$–$C_4$alkoxy, or $R_9$ is phenyl-$C_1$–$C_3$alkyl or a group

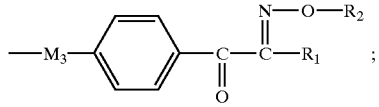

$R_{10}$ and $R_{11}$ independently of each other are hydrogen, $C_1$–$C_{12}$alkyl, $C_2$–$C_4$hydroxyalkyl, $C_2$–$C_{10}$alkoxyalkyl, $C_2$–$C_5$alkenyl, $C_5$–$C_{12}$cycloalkyl, phenyl-$C_1$–$C_3$alkyl, phenyl which is unsubstituted or substituted by $C_1$–$C_{12}$alkyl or $C_1$–$C_4$alkoxy, or $R_{10}$ and $R_{11}$ are $C_2$–$C_3$alkanoyl, $C_3$–$C_6$alkenoyl or benzoyl, or $R_{10}$ and $R_{11}$ together are $C_2$–$C_6$alkylene optionally interrupted by —O— or —NR$_8$—, or $R_{10}$ and $R_{11}$ together are $C_2$–$C_6$alkylene which can be substituted by hydroxyl, $C_1$–$C_4$alkoxy, $C_2$–$C_4$alkanoyloxy or benzoyloxy, or, when $R_{10}$ is hydrogen, $R_{11}$ may be a group

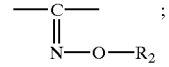

$R_{12}, R_{13}, R_{14}, R_{15}, R_{16}, R_{17}, R_{18}$ and $R_{19}$ independently of one another are hydrogen, halogen, $C_1$–$C_{12}$alkyl, cyclopentyl, cyclohexyl or phenyl which is unsubstituted or substituted by one or more $OR_8$, $SR_9$ or $NR_{10}R_{11}$, or $R_{12}, R_{13}, R_{14}, R_{15}, R_{16}, R_{17}, R_{18}$ and $R_{19}$ are benzyl benzoyl, $C_2$–$C_{12}$alkanoyl, $C_2$–$C_{12}$alkoxycarbonyl optionally interrupted by one or more —O— and/or optionally substituted by one or more hydroxyl groups or $R_{12}, R_{13}, R_{14}, R_{15}, R_{16}, R_{17}, R_{18}$ and $R_{19}$ are phenoxycarbonyl or a group $OR_8$, $SR_9$, $SOR_9$, $SO_2R_9$, $NO_2$, CN, $CONR_{10}R_{11}$, or $NR_{10}R_{11}$, wherein the substituents $OR_8$, $SR_9$ and $NR_{10}R_{11}$ may form 5- or 6-membered rings via the radicals $R_8, R_9, R_{10}$ and/or $R_{11}$ with further substituents on the phenyl ring or with one of the carbon atoms on the phenyl ring or, when $M_4$ is a direct bond, $R_{15}$ and $R_{16}$ together are ethylene or ethynylene;
t is 0 or 1;
M is $C_1$–$C_{12}$alkylene, cyclohexylene, phenylene, —COO—($C_2$–$C_{12}$alkylene)—OOC—, —COO—($CH_2CH_2O)_n$—OC— or —CO—($C_2$–$C_{12}$-alkylene)—CO—;
$M_1$ is a direct bond or $C_1$–$C_{12}$alkylenoxy, optionally interrupted by 1 to 5 —O—, —S— and/or —NR$_{10}$—;
$M_2$ is a direct bond or $C_1$–$C_{12}$alkylene-S—, optionally interrupted by 1 to 5 —O—, —S— and/or —NR$_{10}$—;
$M_3$ is a direct bond, a piperazino group, or $C_1$–$C_{12}$alkylene-NR$_{10}$—, optionally interrupted by 1 to 5—O—, —S— and/or —NR$_{10}$—;
$M_4$ is a direct bond, —O—, —S—, —SO—, —SO$_2$—, —CO—, —CH$_2$—, —NR$_{10}$—, or a group $$-\underset{\underset{N-O-R_2}{\|}}{C}-$$

Ar is a 5- or 6-membered aromatic heterocyclic ring, which is unsubstituted or substituted by one or more $C_1$–$C_6$alkyl, phenyl, halogen, $OR_8$, $SR_9$, $NR_{10}R_{11}$, CN, $C_2$–$C_6$alkanoyl or benzoyl;
wherein 1-phenyl-1,2-propanedione-2-o-benzoyl oxime and 1-phenyl-1,2-propanedione-2-o-ethoxycarbonyl oxime are excluded;
(C) a photopolymerizable reactive or unreactive diluent; and
(D) as a thermosetting component an epoxy compound containing at least two epoxy groups in one molecule;
exhibit an unexpectedly good performance.

Substituted radicals phenyl are substituted one to four times, for example one, two or three times, especially two or three times. Substituents on the phenyl ring are preferably in positions 4 or in 3,4-, 3,4,5-, 2,6-, 2,4- or 2,4,6-configuration on the phenyl ring, in particular in 4- or 3,4-configuration.

$C_1$–$C_{20}$alkyl is linear or branched and is, for example, $C_1$–$C_{18}$-, $C_1$–$C14$-, $C_1$–$C_{12}$-, $C_1$–$C_8$-, $C_1$–$C_6$- or $C_1$–$C_4$alkyl or $C_4$–$C_{12}$-, $C_4$–$C_8$alkyl or, in particular, $R_1$ is $C_6$–$C_{20}$ alkyl or $C_6$–$C_{12}$alkyl. Examples are methyl, ethyl, propyl, isopropyl, n-butyl, sec-butyl, isobutyl, tert-butyl, pentyl, hexyl, heptyl, 2,4,4-trimethylpentyl, 2-ethylhexyl, octyl, nonyl, decyl, dodecyl, tetradecyl, pentadecyl, hexadecyl, octadecyl and icosyl.

$C_1$–$C_{12}$alkyl, $C_2$–$C_{12}$alkyl, $C_1$–$C_8$alkyl, $C_1$–$C_6$alkyl, $C_2$–$C_6$alkyl and $C_1$–$C_4$alkyl have the same meanings as given above for $C_1$–$C_{20}$alkyl up to the corresponding number of C-atoms.

$C_2$–$C_{20}$alkyl which is interrupted by one or more —O— is for example interrupted 1–9, 1–5, 1–3 or once or twice by —O—. Two O-atoms are separated by at least two methylene groups, namely ethylene. The alkyl groups are linear or branched. For example the following structural units will occur, —CH$_2$—CH$_2$—O—CH$_2$CH$_3$, —[CH$_2$CH$_2$O]$_y$—CH$_3$, wherein y=1–9, —(CH$_2$—CH$_2$O)$_7$CH$_2$CH$_3$, —CH$_2$—CH(CH$_3$)—O—CH$_2$—CH$_2$CH$_3$ or —CH$_2$—CH(CH$_3$)—O—CH$_2$—CH$_3$. $C_2$–$C_6$alkyl which is interrupted by 1 or 2—O— is for example —CH$_2$CH$_2$—O—CH$_2$CH$_2$—OCH$_2$CH$_3$ or —CH$_2$CH$_2$—O—CH$_2$CH$_3$. $C_2$–$C_{12}$alkyl and $C_2$–$C_6$alkyl which is interrupted by —O— can have the same meanings as given above for $C_2$–$C_{20}$alkyl up the corresponding number of C- and O-atoms.

$C_2$–$C_4$hydroxyalkyl means $C_2C_4$alkyl, which is substituted by one or two hydroxy groups. The alkyl radical is linear or branched. Examples are 2-hydroxyethyl, 1-hydroxyethyl, 1-hydroxypropyl, 2-hydroxypropyl, 3-hydroxypropyl, 1-hydroxybutyl, 4-hydroxybutyl, 2-hydroxybutyl, 3-hydroxybutyl, 2,3-dihydroxypropyl, or 2,4-dihydroxybutyl.

$C_5$–$C_{12}$Cycloalkyl is for example cyclopentyl, cyclohexyl, cyclooctyl, cyclododecyl, especially cyclopentyl and cyclohexyl, preferably cyclohexyl.

$C_1$–$C_4$alkoxy is linear or branched, for example, methoxy, ethoxy, propoxy, isopropoxy, n-butyloxy, sec-butyloxy, isobutyloxy, tert-butyloxy.

$C_2$–$C_{10}$alkoxyalkyl is $C_2$–$C_{10}$alkyl, which is interrupted by one O-atom. $C_2$–$C_{10}$alkyl has the same meanings as given above for $C_1$–$C_{20}$alkyl up to the corresponding number of C-atoms. Examples are methoxymethyl, methoxyethyl, methoxypropyl, ethoxymethyl, ethoxyethyl, ethoxypropyl, propoxymethyl, propoxyethyl, propoxypropyl.

$C_2$–$C_{12}$alkanoyl is linear or branched and is, for example, $C_2$–$C_8$-, $C_2$–$C_6$- or $C_2$–$C_4$alkanoyl or $C_4$–$C_{12}$- or $C_4$–$C_8$alkanoyl. Examples are acetyl, propionyl, butanoyl, isobutanoyl, pentanoyl, hexanoyl, heptanoyl, octanoyl, nonanoyl, decanoyl or dodecanoyl, preferably acetyl. $C_2$–$C_8$alkanoyl, $C_2$–$C_6$alkanoyl and $C_2$–$C_4$alkanoyl have the same meanings as given above for $C_2$–$C_{20}$alkanoyl up to the corresponding number of C-atoms.

$C_2$–$C_4$alkanoyloxy is linear or branched, for example acetyloxy, propionyloxy, butanoyloxy, isobutanoyloxy, preferably acetyloxy. $C_2$–$C_{12}$alkoxycarbonyl is a linear or branched and is, for example, methoxycarbonyl, ethoxycarbonyl, propoxycarbonyl, n-butyloxycarbonyl, isobutyloxycarbonyl, 1,1-dimethylpropoxycarbonyl, pentyloxycarbonyl, hexyloxycarbonyl, heptyloxycarbonyl, octyloxycarbonyl, nonyloxycarbonyl, decyloxycarbonyl or dodecyloxycarbonyl, especially methoxycarbonyl, ethoxycarbonyl, propoxycarbonyl, n-butyloxycarbonyl or iso-butyloxycarbonyl, preferably methoxycarbonyl. $C_2$–$C_6$alkoxycarbonyl and $C_2$–$C_4$alkoxycarbonyl have the same meanings as given above for $C_2$–$C_{12}$alkoxycarbonyl up to the corresponding number of C-atoms.

$C_2$–$C_{12}$alkoxycarbonyl which is interrupted by one or more —O— is linear or branched. The number of atoms is from 1 to 5, for example 1 to 4, 1 to 3, 1 or 2. Two O-atoms are separated by at least two methylene groups, namely ethylene.

Phenoxycarbonyl is

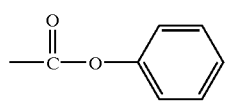

Substituted phenoxycarbonyl radicals are substituted one to four times, for example one, two or three times, especially two or three times. Substituents on the phenyl ring are preferably in positions 4 or in 3,4-, 3,4,5-, 2,6-, 2,4- or 2,4,6-configuration on the phenyl ring, in particular in 4- or 3,4-configuration.

Phenyl-$C_1$–$C_3$alkyl is for example benzyl, phenylethyl, α-methylbenzyl or α,α-dimethylbenzyl, especially benzyl.

$C_2$–$C_{20}$alkenyl radicals may be mono or polyunsaturated and are for example $C_2$–$C_{12}$-, $C_2$–$C_6$-alkenyl, e.g. allyl, methallyl, 1,1-dimethylallyl, 1-butenyl, 3-butenyl, 2-butenyl, 1,3-pentadien-yl, 5-hexenyl, 7-octenyl or dodecenyl, tetradecenyl, pentadecenyl, hexadecenyl, octadecenyl and icosenyl especially allyl.

$C_2$–$C_{20}$alkynyl radicals are for example $C_2$–$C_{12}$-, $C_2$–$C_6$-alkynyl and may be mono or polyunsaturated and are for example ethynyl, propargyl, 1-butynyl, 3-butynyl, 2-butynyl, 5-hexynyl, 7-octynyl or dodecynyl, tetradecynyl, pentadecynyl, hexadecynyl, octadecynyl or icosynyl.

$C_3$–$C_6$alkenoxy radicals may be mono or polyunsaturated and are for example allyloxy, methallyloxy, butenyloxy, pentenoxy, 1,3-pentadienyloxy, 5-hexenyloxy.

$C_3$–$C_6$alkenoyl radicals may be mono or polyunsaturated and are for example propenoyl, 2-methyl-propenoyl, butenoyl, pentenoyl, 1,3-pentadienoyl, 5-hexenoyl.

$C_1$–$C_{12}$alkylenoxy is linear or branched and is $C_1$–$C_8$-, $C_1$–$C_6$- or $C_1$–$C_4$alkylenoxy, for example methylenoxy, ethylenoxy, propylenoxy, isopropylenoxy, n-butylenoxy, sec-butylenoxy, isobutylenoxy, tert-butylenoxy, pentylenoxy, hexylenoxy, heptylenoxy, 2,4,4-trimethylpentylenoxy, 2-ethylhexylenoxy, octylenoxy, nonylenoxy, decylenoxy or dodecylenoxy.

$C_1$–$C_{12}$alkylen-S— has the same meanings as given for $C_1$–$C_{12}$alkylenoxy, wherein the O-atom is exchanged by a sulfur atom.

$C_1$–$C_{12}$alkylen-$NR_{10}$— has the same meanings as given for $C_1$–$C_{12}$alkylenoxy, wherein the O-atom is exchanged by a —$NR_{10}$—.

Halogen is fluorine, chlorine, bromine and iodine, especially fluorine, chlorine and bromine, preferably fluorine and chlorine.

$C_6$–$C_{12}$aryl is for example phenyl, 1-naphthyl, 2-naphthyl, preferably phenyl.

If the radicals $R_{10}$ and $R_{11}$ together are $C_2$–$C_6$alkylene optionally interrupted by —O—or —$NR_8$—, they form a ring together with the N-atom to which they are bonded. Examples for such rings are morpholino, piperidino, especially morpholino.

If the substituents $OR_8$, $SR_9$ and $NR_{10}R_{11}$ on a phenyl ring form 5- or 6-membered rings via the radicals $R_8$, $R_9$, $R_{10}$ and/or $R_{11}$ with further substituents on the phenyl ring or with one of the carbon atoms of the phenyl ring, structures comprising two or four rings (inclusive the phenyl ring) are obtained. Examples are

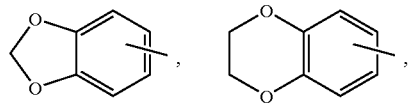

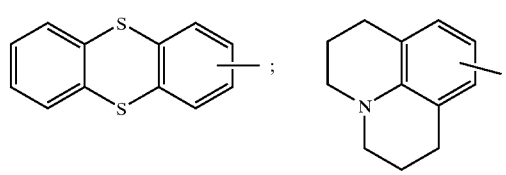

If $R_1$ together with $R_3$ or $R_1$ together with $R_7$ form 5 or 6 membered rings including one or more CO— and/or oxime-groups, for example structures of the following kind are built

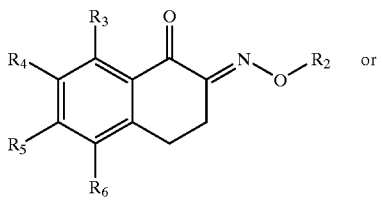

or

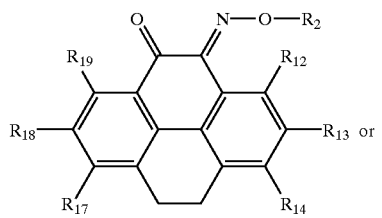

If $R_{15}$ and $R_{16}$ together are ethylene or ethynylene, for example, the following structures are built

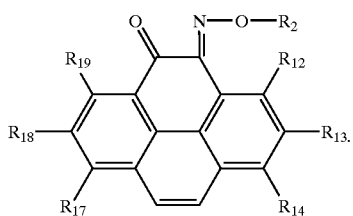

Ar as 5- or 6-membered heterocyclic ring comprises O-, S- or N-atoms as heteroatoms and is for example furyl, thienyl, pyrrolyl, oxinyl, dioxinyl or pyridyl. The heterocyclic ring may be substituted by one or more, for example one or two branched or unbranched $C_1$–$C_6$alkyl as methyl, ethyl, propyl, butyl, pentyl or hexyl, in particular $C_1$–$C_4$alkyl. Examples are dimethylpyridyl, dimethylpyrrolyl or methylfuryl.

Examples for compounds of formula VI are

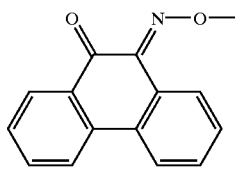, 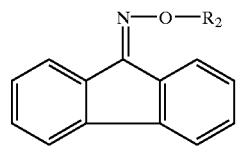,

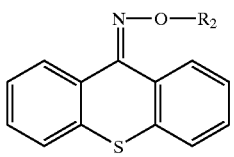, 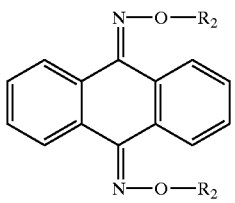 or

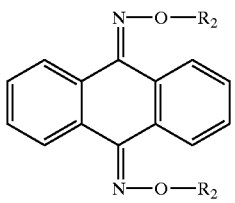

Preferred are compositions, wherein in the compound of formula I and III, $R_1$ is phenyl which is unsubstituted or substituted by one or more $C_1$–$C_6$alkyl, phenyl, halogen, $OR_8$, $SR_9$ or $NR_1R_{11}$ or $R_1$ is $C_6$–$C_{20}$alkyl or $C_2$–$C_{20}$alkyl optionally interrupted by one or more —O— and/or optionally substituted by one or more hydroxyl groups.

$R_1$ preferably is phenyl which is unsubstituted or substituted by one or more $C_1$–$C_6$alkyl, phenyl, halogen, $OR_8$, $SR_9$ or $NR_{10}R_{11}$, or $R_1$ is $C_6$–$C_{20}$alkyl which is unsubstituted or substituted by one or more $C_1$–$C_6$alkyl, phenyl, $OR_8$, $SR_9$ or $NR_{10}R_{11}$.

Preferred are compositions comprising compounds of formulae I and III, particularly of formula I. Preferred are further compounds, wherein $R_3$ and $R_7$ are hydrogen. $R_1$ is preferably $C_1$–$C_{12}$alkyl, in particular $C_6$–$C_{12}$alkyl. $R_2$ is preferably tolyl or benzoyl or acetyl.

Oxime esters of formulae I, II, III, IV and V are prepared by methods described in the literature, for example by reaction of the corresponding oximes ($R_2$=H) with an acyl chloride or an anhydride in an inert solvent such as for example tetrahydrofuran or dimethylformamide in the presence of a base, for example a tertiary amine, such as triethylamine, or in a basic solvent such as pyridine.

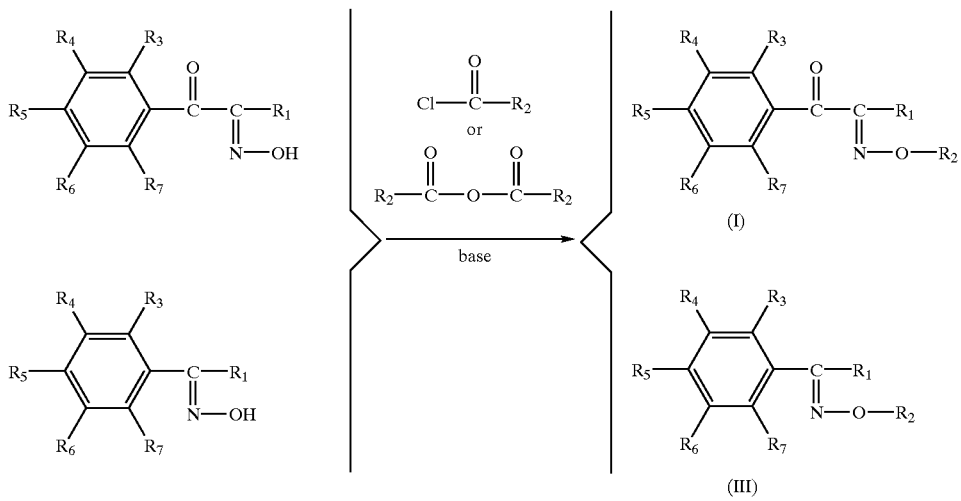

For compounds of formula V in the above scheme the group

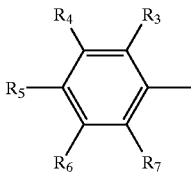

is exchanged by a heterocyclic radical.

Such reactions are well known to those skilled in the art, and are generally carried out at temperatures of −15 to +50° C., preferably 0 to 20° C.

The compounds of formulae II and IV can be obtained analogously by using the appropriate oximes as starting materials:

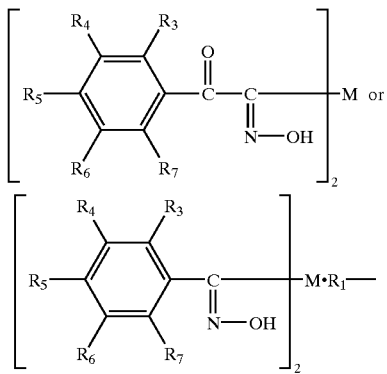

$R_1$–$R_7$ and M have the meanings given above.

The oximes required as starting materials can be obtained by a variety of methods described in standard chemistry textbooks (for instance in J. March, Advanced Organic Chemistry, 4th Edition, Wiley lnterscience, 1992), or in specialized monographs, for example, S. R. Sandier & W. Karo, Organic functional group preparations, Vol. 3, Academic Press. One of the most convenient methods is, for example, the reaction of ketones with hydroxylamine or its salt in polar solvents like ethanol or aqueous ethanol. In that case, a base such as sodium acetate is added to control the pH of the reaction mixture. It is well known that the rate of the reaction is pH-dependent, and the base can be added at the beginning or continuously during the reaction. Basic solvents such as pyridine can also be used as base and/or solvent or cosolvent. The reaction temperature is generally the refluxing temperature of the mixture, usually 60–120° C. Another convenient synthesis of oximes is the nitrosation of "active" methylene groups with nitrous acid or an alkyl nitrite. Both alkaline conditions, as described for example in Organic Syntheses coll. Vol. VI (J. Wiley & Sons, New York, 1988), pp 199 and 840, and acidic conditions, as described, for example, in Organic Synthesis coll. vol V, pp 32 and 373, coll. vol. 111, pp 191 and 513, coll. vol.II, pp. 202, 204 and 363, are suitable for the preparation of the oximes used as starting materials in the invention. Nitrous acid is usually generated from sodium nitrite. The alkyl nitrite can be for example methyl nitrite, ethyl nitrite, isopropyl nitrite, butyl nitrite, isoamyl nitrite. Every oxime ester group can exist in two configurations, (Z) or (E). It is possible to separate the isomers by conventional methods, but it is also possible to use the isomeric mixture as photoinitiating species.

The compounds of the formulae I, II, III, IV and V can be used as photoinitiators for the photopolymerization of ethylenically unsaturated compounds or of mixtures which comprise such compounds.

Component (A) in the composition according to the invention is an oligomer or polymer, which contains at least one free carboxylic acid group in the molecule.

Particularly preferred are compositions wherein the oligomer or polymer (A) contains at least two ethylenically unsaturated polymerizable groups.

The component (A) may be of moderate (oligomeric) or high (polymeric) molecular mass. Examples for this component are oligomers or polymers obtained by reaction of a saturated or unsaturated polybasic acid anhydride with a product of the reaction of an epoxy compound and an unsaturated monocarboxylic acid. As epoxy compounds which are employed for the preparation the most interesting ones are novolak type epoxies.

The aforementioned resin curable by an activated energy ray is obtained by causing a reaction product of a novolak type epoxy compound (as described afterward) and an unsaturated monocarboxylic acid to react with a dibasic acid anhydride such as phthalic anhydride or an aromatic polycarboxylic acid anhydride such as trimellitic acid anhydride or pyromellitic acid anhydride. In this case, the resin proves particularly suitable when, in the production thereof, the amount of the aforementioned acid anhydride used for the reaction exceeded 0.15 mol per each of the hydroxyl groups possessed by the reaction product of the novolak type epoxy compound and the unsaturated carboxylic acid.

The acid value of the resin so obtained suitably falls in the range of 45 to 160 mg KOH/g, preferably 50 to 140 mg KOH/g.

When the number of ethylenically unsaturated bonds present in the molecular unit of the resin curable by the activated energy ray is small, the photosetting proceeds slowly and it is desirable to use a novolak type epoxy compound as a raw material. For the purpose of lowering the viscosity of the ink, it is possible to use bis-phenol A type epoxy compounds instead.

The novolak type epoxy compounds are represented by phenol novolak type epoxy resins and cresol novolak type epoxy resins. Compounds as are produced by causing epichlorohydrin to react with a pertinent novolak resin by the conventional method can be used. Typical examples of the aforementioned acid anhdyride are dibasic acid anhydrides such as for example maleic anhydride, succinic anhydride, itaconic anhydride, phthalic anhydride, tetrahydrophthalic anhydride, hexahydrophthalic anhydride, methyhexahydrophthalic anhydride, endomethylenetetrahydrophthalic anhydride, methyldneomethylenetetrahydrophthalic anhydride, chlorendic anhydride, and methyltetrahydrophthalic anhydride; aromatic polycarboxylic anhydrides such as for example trimellitic anhydride pyromellic anhydride, and benzophenonetetracarboxylic dianhydride: and polycarboxylic anhydride derivatives such as 5-(2,5-dioxotetrahydrofuryl)-3-methyl-3-cyclohexene-1,2-dicarboxylic anhydride.

Further examples for component (A) are reaction products obtained by adding epoxy group containing acrylic acid ester or methacrylic acid ester compounds to a part of the carboxyl groups of a copolymer resulting of the reaction of acrylate or methacrylate with acrylic acid or methacrylic acid.

The copolymer of acrylic acid ester and/or methacrylic acid ester and acrylic acid and/or methacrylic acid is obtained by copolymerizing one or two or more of acrylic acid esters and/or methacrylic acids represented by the general formula (1) and (2)

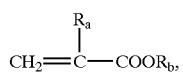  (1)

wherein
R$_a$ is a hydrogen atom or a methyl group, R$_b$ is an aliphatic hydrocarbon group having 1 to 6 carbon atoms,
and acrylic acid and/or methacrylic acid represented by the general formula (2);

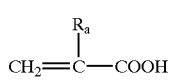  (2)

wherein R$_a$ has the same meaning as given above, according to routine methods such as solution polymerization.

Preferably the molar ratio between the acrylic acid ester and/or methacrylic acid ester and the acrylic acid and/or methacrylic acid is from 30:70 to 70:30.

The ester group of each of the acrylic acid ester and/or methacrylic acid ester may be appropriately selected from various aliphatic groups containing 1 to 6 carbon atoms.

The reaction product is obtained by adding to the copolymer thus obtained acrylic acid ester and/or methacrylic acid ester having a terminal epoxy group, represented by the following general formula (3);

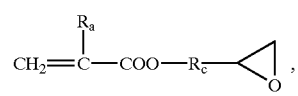  (3)

wherein
R$_a$ has the same meaning as described above;
R$_c$ is an aliphatic hydrocarbon group or aromatic hydrocarbon group having 1 to 12 carbon atoms.

In order to obtain the reaction product suitable for the present invention, a compound of formula (3) is added to the aforementioned monomers of formula (1) and (2) at a ratio of 10 to 40 mol %, to provide the copolymer with ultraviolet curability.

The reaction product thus obtained is preferably has an average molecular weight in the range of 20,000 to 70,000; the softening point suitably is in the range from 35° C. to 130° C., and the acid value is 50 to 150.

Further examples for component (A) are resins having α,β-unsaturated double bonds on the side chains, and having an acid value of 50–200. The photopolymerizable resin, for example, is constituted of 70–95% by weight of an ethylenically unsaturated acid component and a copolymerizable component thereof. It is an addition product formed between a carboxyl group-containing resin having an acid value (the acid value is expressed by milligram number of potassium hydroxide necessary for neutralizing 1 gram of resin) of no less than 500, preferably no less than 600 and in particular no less than 620, and having a number average molecular weight of 1,000–100,000, preferably 3,000–70,000, and an unsaturated compound having an α,β-unsaturated double bond and an epoxy group. The content of the ethylenically unsaturated acid component in the carboxyl group-containing resin of the photopolymerizabe resin is 70–95% by weight, due to which the photopolymerizable resin (A) does not become insoluble in water or dilute alkaline aqueous solution even after an unsaturated compound having an α,β-unsaturated double bond and an epoxy group is added thereto, and retains its solubility. Examples of such resins are described in JP 8-339081-A.

The carboxyl group-containing resin (A), for example, is produced by dissolving 70–95% by weight, preferably 78–88% by weight and in particular 80–85% by weight, of an ethylenically unsaturated acid monomer and 5–30% by weight, preferably 22–12% by weight and in particular 15–20% by weight, of a copolymerizable monomer in a suitable unreactive solvent and thermally polymerizing the solution at 45–120° C. in the presence of a thermal polymerization initiator. Thus, a carboxyl group-containing resin having an acid value of no less than 500 and a number average molecular weight of 1,000–100,000 can be produced in a high safety and a high stability.

Specific examples of the ethylenically unsaturated monomer suitable for production of the carboxyl group-containing resin (A) include acrylic acid, methacrylic acid, crotonic acid, isocrotonic acid, angelic acid, tiglic acid, 2-ethylacrylic acid, 3-propylacrylic acid, 3-isopropylacrylic acid, succinic acid mono-hydroxyethylacrylate, phthalic acid mono-hydroxyethylacrylate, dihydrophthalic acid monohydroxyethylacrylate, tetrahydrophthalic acid monohydroxyethylacrylate, hexahydrophthalic acid monohydroxyethyl-acrylate, acrylic acid dimer, acrylic acid trimer, ω-carboxy-polycaprolactone monoacrylate and ω-carboxy-polycaprolactone monomethacrylate. Among these monomers, preferred are acrylic acid, methacrylic acid, crotonic acid, isocrotonic acid, angelic acid, tiglic acid, 2-ethylacrylic acid, 3-propylacrylic acid, 3-isopropylacrylic acid, ω-carboxy-polycaprolactone monoacrylate, ω-carboxy-polycaprolactone monomethacrylate, and the like; and particularly preferred are acrylic acid, methacrylic acid, crotonic acid, isocrotonic acid, angelic acid, tiglic acid, 2-ethylacrylic acid, 3-propylacrylic acid, 3-isopropylacrylic acid, ω-carboxy-polycaprolactone monoacrylate, and ω-carboxy-polycaprotactone monomethacrylate. These monomers may be used either alone or in mixture of two or more.

Suitable copolymerizable monomers are acrylic esters, methacrylic esters, vinyl monomers, styrene type monomers and cyclic ester monomers. Specific examples thereof include 2-hydroxymethyl acrylate, 2-hydroxymethyl methacrylate, 2-hydroxyethyl acrylate, 2-hydroxyethyl methacrylate, 2-hydroxypropyl acrylate, 2-hydroxypropyl methacrylate, ethyleneglycol monomethyl ether acrylate, ethyleneglycol monomethyl ether methacrylate, ethyleneglycol monoethyl ether acrylate, ethyleneglycol monoethyl ether methacrylate, glycerol acrylate, glycerol methacrylate, dipentaaerythritol pentamethacrylate, dipentaerythritol pentaacrylate, dimethylaminoethyl acrylate, dimethylamino-ethyl methacrylate, tetrahydrofurfuryl acrylate, tetrahydro-furfuryl methacrylate, acrylic acid amide, methacrylic acid amide, acrylonitrile, methacrylonitrile, methyl acrylate, methyl methacrylate, ethyl acrylate, ethyl methacrylate, butyl acrylate, butyl methacrylate, isobutyl acrylate, isobutyl methacrylate, 2-ethylhexyl acrylate, 2-ethylhexyl-methacrylate, benzyl acrylate, benzyl methacrylate, acrylic acid carbitol, methacrylic acid carbitol, ε-caprolactone-modified tetrafurfuryl acrylate, ε-caprolactone-modified tetrafurfuryl methacrylate, diethyleneglycol ethoxyl acrylate, isodecyl acrylate, isodecyl methacrylate, octyl acrylate, octyl methacrylate, lauryl acrylate, lauryl methacrylate, tridecyl acrylate, tridecyl methacrylate, stearyl acrylate, stearyl methacrylate and the like. These monomers may be used either alone or in mixtures of two or more.

Suitable thermal polymerization initiators are for example, 2,2'-azobis-(2,4-dimethylvaleronitrile) (usable temperature 45–70° C.), 2,2'-azobis(isobutyronitrile) (usable temperature 60–90° C.), 2,2'-azobis(2-methylisobutyronitrile) (usable temperature 60–95° C.), tert-butyl peroctoate (usable temperature 75–100° C.), 1,1'-azobis(cyclohexane-1-carbonitrile) (usable temperature 80–110° C.) or 1-[(1-diazo-1-methylethyl)azo]-formamide (usable temperature 95–120° C.). At least one of the cited compounds is used.

The carboxyl group-containing resin produced according to the aforementioned method is then modified into a photopolymerizable resin whose carboxyl group is esterified and whose side chains have α,β-unsaturated double bonds, through an esterification with an unsaturated compound having an α,β-unsaturated double bond and a epoxy group. Examples of suitable compounds having an α,β-unsaturated double bond and an epoxy group, are given below. At least one member selected from the group consisting of glycidyl acrylate, glycidyl methacrylate, compounds of the formula 4, 5, 6, as defined below, is used.

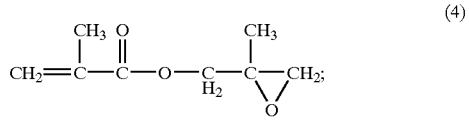

(4)

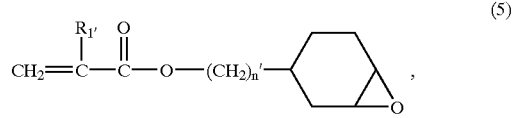

(5)

wherein $R_1'$ is hydrogen or methyl and n' is an integer of 1–10;

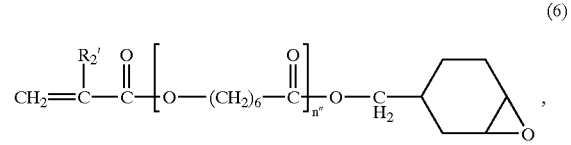

(6)

wherein $R_2'$ is hydrogen or methyl and n" is an integer of 1–3.

Among these compounds, compounds having alicyclic epoxy groups are particularly preferred, because these compounds have a high reactivity with carboxyl group-containing resins, accordingly the reaction time can be shortened. These compounds further do not cause gelation in the process of reaction and make it possible to carry out the reaction stably. On the other hand, glycidyl acrylate and glycidyl methacrylate are advantageous from the viewpoint of sensitivity and heat resistance because they have a low molecular weight and can give a high conversion of esterification.

The photopolymerizable resin obtained by the above-mentioned method has α,β-unsaturated double bonds on its side chains. Its acid value is 50–200, preferably 70–150, and in particular 85–120. Its number average molecular weight is 7,000–10,000, and its glass transition point (hereinafter referred to as Tg) is 30–120° C. When the photopolymerizable resin is used as a solder resist, an acid value of no less than 70 is preferable, because other additive ingredients may further be added to the composition.

An inert organic solvent is used at the time of carrying out the esterification and preparing the photosensitive resin composition.

Commercially available unsaturated compounds (A), as described before are, for example EB3800, EB9692, EB9694, EB9695, EB9696 (UCB Chemicals), KAYARAD TCR1025 (Nippon Kayaku Co.,LTD.), NEOPOL8319 (U-Pica), EA-6340 (Shin Nakamura Chemical Co., Ltd.), ACA200M, ACA250 (Daicel Industries, Ltd.).

Preferred is a composition, wherein the oligomer or polymer (A) is a resin obtained by the reaction of a saturated or unsaturated polybasic acid anhydride with a product of the reaction of an epoxy compound and an unsaturated monocarboxylic acid, or is an addition product formed between a carboxyl group-containing resin and an unsaturated compound having an α,β-unsaturated double bond and an epoxy group.

Examples of reactive or unreactive diluents (C) which are suitable in the compositions according to the invention are photopolymerizable vinyl type monomers and/or an organic solvents. Representative examples of the photopolymerizable vinyl type monomers are hydroxyalkyl acrylates such as 2-hydroxyethyl acrylate, 2-hydroxybutyl acrylate, etc.; mono- or diacrylates of glycols such as ethylene glycol, methoxytetraethylene glycol, polyethylene glycol, propylene glycol, etc.; acrylamides such as N,N-dimethylacrylamide, N-methylolacrylamide, etc.; aminoalkyl acrylates such as N,N-dimethylaminoethyl acrylate, etc.; polyvalent acrylates of polyvalent alcohols or ethylene oxide or propylene oxide adducts thereof such as hexanediol, trimethylolpropane, pentaerythritol, dipentaerythritol, tris-hydroxyethyl isocyanurate, etc.; phenoxy acrylate, bisphenol A diacrylate and acrylates of ethylene oxide or propylene oxide adducts of these phenols, etc.; acrylates of glycidyl ethers such as glycerin diglycidyl ether, trimethylolpropane triglycidyl ether, triglycidyl isocyanurate, etc.; and melamine acrylate, and/or methacrylates corresponding to the above acrylates, etc.

On the other hand, examples for suitable organic solvents are ketones such as ethyl methyl ketone, cyclohexanone, etc.; aromatic hydrocarbons such as toluene, xylene, tetramethylbenzene, etc.; glycol ethers such as methyl cellosolve, ethyl cellosolve, butyl cellosolve, benzyl cellosolve, phenyl cellosolve, methylcarbitol, butylcarbitol, propylene glycol monomethyl ether, dipropylene glycol monomethyl ether, dipropylene glycol monobutyl ether, triethylene glycol monoethyl ether, etc.; esters such as ethyl acetate, butyl acetate and esterified products of the above glycol ethers such as cellosolve acetate, butyl cellosolve acetate, carbitol acetate, butyl carbitol acetate; alcohols such as ethanol, propanol, n-butanol, n-hexanol, n-heptanol, n-octanol, ethylene glycol, propylene glycol, etc.; aliphatic hydrocarbons such as octane, decane, etc.; a petroleum type solvent such as petroleum ether, petroleum naphtha, hydrogenated petroleum naphtha, solvent naphtha, etc. and others. The organic solvent is used for diluting the resin so that it can be coated easily.

The diluents (C) as described above are used singly or as a mixture of two or more of them. The suitable amount is from 5 to 300 parts by weight, preferably 10 to 150 parts by weight, based on 100 parts by weight of component (A).

The above described diluent is used to dilute the components of the mixture so that they can be coated easily. Another purpose, if a photopolymerizable vinyl type monomer is used, is to strengthen the photopolymerizability. Further, if an organic solvent is used as diluent, the diluent supports to dissolve and dilute the photosensitive prepolymer, whereby the prepolymer can be coated in a liquid state and then dried to form a film. Therefore, depending on the diluent used, an exposure system of either a contact system in which a photomask is contacted with the coating film or a non-contact system (e.g. laser beam writing) may be used.

Preferably component (C) is a monomer with more than two acrylate or methacrylate groups.

As thermosetting component (D) compounds having epoxy groups are employed. There may be used a solid or liquid known epoxy compound, and said epoxy compound is used depending on required characteristics. For example, when the plating resistance is to be improved, a liquid epoxy resin is used, and when water resistance is required, an epoxy resin having a large number of methyl groups on a benzene ring or a cycloalkyl ring is employed. A preferred epoxy resin, is a bisphenol S type epoxy resin such as BPS-200 produced by Nippon Kayaku Co., Ltd., EPX-30 produced by ACR Co., Epiculon EXA-1514 produced by Dainippon Ink & Chemicals Inc., etc.; a bisphenol A type epoxy resin such as Epiculon N-3050, N-7050, N-9050 produced by Dainippon Ink & Chemicals Inc., XAC-5005, GT-7004, 6484T, 6099 produced by Ciba Specialty Chemicals Inc., etc. ; a bisphenol F type epoxy resin such as YDF-2004, YDF2007 produced by Tohto Kasei Co., etc.; a diglycidyl phthalate resin such as Blemmer DGT produced by Nippon Oil and Fats Co., Ltd., etc.; a heterocyclic epoxy resin such as TEPIC produced by Nissan Chemical Industries, Ltd., Araldite PT810 produced by Ciba Specialty Chemicals Inc., etc.; a bixylenol type epoxy resin such as YX-4000 produced by Yuka Shell Co., etc.; a biphenol type epoxy resin such as YL-6056 produced by Yuka Shell Co., etc.; a tetraglycidyl xylenoylethane resin such as ZX-1063 produced by Tohto Kasei Co., etc.; a novolak type epoxy resin such as EPPN-201, EOCN-103, EOCN-1020, EOCN-1025 and BRRN produced by Nippon Kayaku Co., Ltd., ECN-278, ECN-292 and ECN-299 produced by Asahi Chemical Industry Co., Ltd., GY-1180, ECN-1273 and ECN-1299 produced by Ciba Specialty Chemicals Inc., YDCN-220L, YDCN-220HH, YDCN-702, YDCN-704, YDPN-601 and YDPN-602 produced by Tohto Kasei Co., Epiculon-673, N-680, N-695, N-770 and N-775 produced by Dainippon Ink & Chemicals Inc., etc.; a novolak type epoxy resin of bisphenol A such as EPX-8001, EPX-8002, EPPX-8060 and EPPX-8061 produced by Asahi Chemical Industry Co., Ltd., Epiculon N-880 produced by Dainippon Ink & Chemicals Inc., etc.; a chelate type epoxy resin such as EPX-49-69 and EPX-49-30 produced by Asahi Denka Kogyo K. K., etc.; a glyoxal type epoxy resin such as YDG-414 produced by Tohto Kasei Co., etc., an amino group-containing epoxy resin such as YH-1402 and ST-110 produced by Tohto Kasei Co., YL-931 and YL-933 produced by Yuka Shell Co., etc.; a rubber-modified epoxy resin such as Epiculon TSR-601 produced by Dainippon Ink & Chemicals Inc., EPX-84-2 and EPX-4061 produced by Asahi Denka Kogyo K. K., etc.; a dicyclopentadiene phenolic type epoxy resin such as DCE-400 produced by Sanyo-Kokusaku Pulp Co., Ltd., etc.; a silicone-modified epoxy resin such as X-1359 produced by Asahi Denka Kogyo K. K., etc.; an ε-caprolactone-modified epoxy resin such as Plague G-402 and G-710 produced by Dicel Chemical Industries, Ltd., etc. and others. Further, partially esterified compounds of these epoxy compounds (e.g. esterified by (meth)acrylates) can be used in combination.

The suitable amount of component (D) to be used according to the present invention is 10 to 150 parts by weight, preferably 20 to 80 parts by weight, based on 100 parts by weight of component (A).

Preferably component (D) is a bisphenol A, bisphenol S, bisphenol F or novolak type epoxy compound.

In some cases it may be advantageous to use sensitizer compounds in combination with the compounds of the formula I, II, III, IV, V and VI. Another object of the invention therefore resides in a composition which additionally to the components (A), (B), (C) and (D) comprises at least one photosensitizer compound (E), and/or further additives (F).

Photopolymerization can also be accelerated by adding further photosensitizer compounds (E) which shift or broaden the spectral sensitivity. These are, in particular, aromatic carbonyl compounds, for example benzophenone, thioxanthone, anthraquinone and coumarin derivatives, e.g. 3-acylcoumarins, 3-(aroylmethylene)thiazolines, camphor quinone, but also eosine, rhodamine and erythrosine dyes, as well as all compounds which can be used as co-initiators as described above.

Further suitable examples of such photosensitizers are

1. Thioxanthones

Thioxanthone, 2-isopropylthioxanthone, 2-chlorothioxanthone, 2-dodecylthioxanthone, 2,4-diethylthioxanthone, 2,4-dimethylthioxanthone, 1-methoxycarbonylthioxanthone, 2-ethoxycarbonylthioxanthone, 3-(2-methoxyethoxycarbonyl)-thioxanthone, 4-butoxycarbonylthioxanthone, 3-butoxycarbonyl-7-methylthioxanthone, 1-cyano-3-chlorothioxanthone, 1-ethoxycarbonyl-3-chlorothioxanthone, 1-ethoxycarbonyl-3-ethoxythioxanthone, 1-ethoxycarbonyl-3-aminothioxanthone, 1-ethoxycarbonyl-3-phenyisulfurylthioxanthone, 3,4-di-[2-(2-methoxyethoxy)ethoxycarbonyl]-thioxanthone, 1-ethoxycarbonyl-3-(1-methyl-1-morpholinoethyl)-thioxanthone, 2-methyl-6-dimethoxymethyl-thioxanthone, 2-methyl-6-(1,1-dimethoxybenzyl)-thioxanthone, 2-morpholinomethylthioxanthone, 2-methyl-6-morpholinomethylthioxanthone, N-allylthioxanthone-3,4-dicarboximide, N-octylthioxanthone-3,4-dicarboximide, N-(1,1,3,3-tetramethylbutyl)-thioxanthone-3,4-dicarboximide, 1-phenoxythioxanthone, 6-ethoxycarbonyl-2-methoxythioxanthone, 6-ethoxycarbonyl-2-methylthioxanthone, thioxanthone-2-carboxylic acid polyethyleneglycol ester, 2-hydroxy-3-(3,4-dimethyl-9-oxo-9H-thioxanthon-2-yloxy)-N,N,N-trimethyl-1-propanaminium chloride;

2. Benzophenones benzophenone, 4-phenyl benzophenone, 4-methoxy benzophenone, 4,4'-dimethoxy benzophenone, 4,4'-dimethyl benzophenone, 4,4'-dichlorobenzophenone 4,4'-dimethylaminobenzophenone, 4,4'-diethylaminobenzophenone, 4-methyl benzophenone, 2,4,6-trimethylbenzophenone, 4-(4-methylthiophenyl)-benzophenone, 3,3'-dimethyl-4-methoxy benzophenone, methyl-2-benzoylbenzoate, 4-(2-hydroxyethylthio)-benzophenone, 4-(4-tolylthio)-benzophenone, 4-benzoyl-N,N,N-trimethylbenzenemethanaminium chloride, 2-hydroxy-3-(4-benzoylphenoxy)-N,N,N-trimethyl-1-propanaminium chloride monohydrate, 4-(13-acryloyl-1,4,7,10,13-pentaoxatridecyl)-benzophenone, 4-benzoyl-N,N-dimethyl-N-[2-(1-oxo-2-propenyl)oxy]ethyl-benzenemethanaminium chloride;

3. Coumarins

Coumarin 1, Coumarin 6, Coumarin 7, Coumarin 337, Coumarin 500, 3-benzoyl coumarin, 3-benzoyl-7-methoxycoumarin, 3-benzoyl-5,7-di(propoxy)-coumarin, 3-benzoyl-6,8-dichloro-coumarin, 3-benzoyl-6-chloro-coumarin, 3,3'-carbonyl-bis[5,7-di(propoxy)-coumarin], 3,3'-carbonyl-bis(7-methoxycoumarin), 3,3'-carbonyl-bis(7-diethylamino-coumarin), 3-isobutyroylcoumarin, 3-benzoyl-5,7-dimethoxy-coumarin, 3-benzoyl-5,7-diethoxy-coumarin, 3-benzoyl-5,7-dibutoxy-coumarin, 3-benzoyl-5,7-di(methoxyethoxy)-coumarin, 3-benzoyl-5,7-di(allyl-oxy)-coumarin, 3-benzoyl-7-dimethylaminocoumarin, 3-benzoyl-7-diethylaminocoumarin, 3-isobutyroyl-7-dimethylaminocoumarin, 5,7-dimethoxy-3-(1-naphthoyl)-coumarin, 5,7-dimethoxy-3-(1-naphthoyl)-coumarin, 3-benzoylbenzo[f]coumarin, 7-diethylamino-3-thienoylcoumarin, 3-(4-cyanobenzoyl)-5,7-dimethoxycoumarin;

4. 3-(aroylmethylene)-thiazolines 3-methyl-2-benzoylmethylene-β-naphthothiazoline, 3-methyl-2-benzoylmethylene-benzothiazoline, 3-ethyl-2-propionylmethylene-β-naphthothiazoline;

5. Other carbonyl compounds acetophenone, 3-methoxyacetophenone, 4-phenylacetophenone, benzil, 2-acetylnaphthalene, 2-naphthaldehyde, 9,10-anthraquinone, 9-fluorenone, dibenzosuberone, xanthone, 2,5-bis(4-diethylaminobenzylidene)cyclopentanone, α-(para-dimethylaminobenzylidene)ketones such as 2-(4-dimethylamino-benzylidene)-indan-1-one or 3-(4-dimethylamino-phenyl)-1-indan-5-yl-propenone, 3-phenylthiophthalimide, N-methyl-3,5-di(ethylthio)-phthalimide, N-methyl-3,5-di(ethylthio)-phthalimide;

Component (E) is suitably used in an amount from 0.015 to 60 parts by weight, preferably 0.03 to 30 parts by weight, based on 100 parts by weight of component (A).

In addition to the photoinitiator and/or the sensitizer compound the photopolymerizable mixtures may include various additives (F).

Examples of these are thermal inhibitors, which are intended to prevent premature polymerization, examples being hydroquinone, hydroquinone derivatives, p-methoxyphenol, β-naphthol or sterically hindered phenols, such as 2,6-di-tert-butyl-p-cresol. In order to increase the stability on storage in the dark it is possible, for example, to use copper compounds, such as copper naphthenate, stearate or octoate, phosphorus compounds, for example triphenylphosphine, tributylphosphine, triethyl phosphite, triphenyl phosphite or tribenzyl phosphite, quaternary ammonium compounds, for example tetramethylammonium chloride or trimethylbenzylammonium chloride, or hydroxylamine derivatives, for example N-diethylhydroxylamine. To exclude atmospheric oxygen during the polymerization it is possible to add paraffin or similar wax-like substances which, being of inadequate solubility in the polymer, migrate to the surface in the beginning of polymerization and form a transparent surface layer which prevents the ingress of air. It is also possible to apply an oxygen-impermeable layer. Light stabilizers which can be added in a small quantity are UV absorbers, for example those of the hydroxyphenylbenzotriazole, hydroxyphenyl-benzophenone, oxalamide or hydroxyphenyl-s-triazine type. These compounds can be used individually or in mixtures, with or without sterically hindered amines (HALS).

Examples of such UV absorbers and light stabilizers are 1. 2-(2'-hydroxyyhenyl)benzotriazoles for example 2-(2'-hydroxy-5'-methylphenyl)benzotriazole, 2-(3',5'-di-tert-butyl-2'-hydroxyphenyl)benzotriazole, 2-(5'-tert-butyl-2'-hydro-xyphe-nyl)benzotriazole, 2-(2'-hydroxy-5'-(1,1,3,3-tetramethylbutyl)phenyl)benzotriazole, 2-(3',5'-di-tert-butyl-2'-hydroxyphenyl)-5-chlorobenzotriazole, 2-(3'-tert-butyl-2'-hydroxy-5'-methyl-phenyl)-5-chlorobenzotriazole, 2-(3'-sec-butyl-5'-tert-butyl-2'-hydroxyphenyl)benzotrizole, 2-(2'-hydroxy-4'-octoxyphenyl)benzotriazole, 2-(3',5'-di-tert-amyl-2'-hydroxyphenyl)benzotriazole, 2-(3',5'-bis-(α,α-dimethylbenzyl)-2'-hydroxyphenyl)-benzotriazole, mixture of 2-(3'-tert-butyl-2'-hydroxy-5'-(2-octyloxycarbonylethyl)phenyl)-5-chlorobenzotriazole, 2-(3'-tert-butyl-5'-[2-(2-ethyl-hexyl-oxy)carbonylethyl]-2'-hydroxyphenyl)-5-chlorobenzotriazole, 2-(3'-tert-butyl-2'-hydroxy-5'-(2-methoxycarbonylethyl)phenyl)-5-chlorobenzotriazole, 2-(3'-tert-butyl-2'-hydroxy-5'-(2-methoxycarbonylethyl)phenyl)-benzotriazole, 2-(3'-tert-butyl-2'-hydroxy-5'-(2-octyloxycarbonylethyl)phenyl) benzotriazole, 2-(3'-tert-butyl-5'-[2-(2-ethylhexyloxy) carbonylethyl]-2'-hydroxyphenyl)benzotriazole, 2-(3'-dodecyl-2'-hydroxy-5'-methylphenyl)-benzotriazole, and 2-(3'-tert-butyl-2'-hydroxy-5'-(2-isooctyloxycarbonylethyl)phenylbenzotriazole, 2,2'-methylenebis[4-(1,1,3,3-tetramethylbutyl)-6-benzotriazol-2-yl-phenol]; trans-esterification product of 2-[3'-tert-butyl-5'-(2-methoxycarbonylethyl)-2'-hydroxyphenyl]-benzotriazole with polyethylene glycol 300; [R—CH$_2$CH$_2$—COO(CH$_2$)$_3$]$_2$- where R=3'-tert-butyl-4'-hydroxy-5'-2H-benzotriazol-2-yl-phenyl.

2. 2-Hydroxybenzophenones, for example the 4-hydroxy-, 4-methoxy-, 4-octoxy-, 4-decyloxy-, 4-dodecyloxy-, 4-benzyloxy-, 4,2',4'-trihydroxy- and 2'-hydroxy-4,4'-dimethoxy derivative.

3. Esters of substituted or unsubstituted benzoicacids, for example 4-tert-butylphenyl salicylate, phenyl salicylate, octylphenyl saiicylate, dibenzoylresorcinol, bis(4-tert-butylbenzoyl)resorcinol, benzoylresorcinol, 2,4-di-tert-butylphenyl 3,5-di-tert-butyl-4-hydroxybenzoate, hexadecyl 3,5-di-tert-butyl-4-hydroxybenzoate, octadecyl 3,5-di-tert-butyl-4-hydroxybenzoate, and 2-methyl-4,6-di-tert-butylphenyl 3,5-di-tert-butyl-4-hydroxybenzoate.

4. Acrylates, for example isooctyl or ethyl α-cyano-β,β-diphenyl acrylate, methyl α-carbo-methoxycinnamate, butyl or methyl α-cyano-β-methyl-p-methoxycinnamate, methyl α-carboxymethoxy-p-methoxycinnamate and N-(β-carbomethoxy-β-cyanovinyl)-2-methylindoline.

5. Sterically hindered amines, for example bis-(2,2,6,6-tetramethylpiperidyl) sebacate, bis-(2,2,6,6-tetramethylpiperidyl) succinate, bis-(1,2,2,6,6-pentamethylpiperidyl) sebacate, bis-(1,2,2,6,6-pentamethylpiperidyl) n-butyl-3,5-di-tert-butyl-4-hydroxybenzylmalonate, condensation product of 1-hydroxyethyl-2,2,6,6-tetramethyl-4-hydroxypiperidine and succinic acid, condensation product of N,N'-bis-(2,2,6,6-tetramethyl-4-piperidyl)hexa-methylenediamine and 4-tert-octylamino-2,6-dichloro-1,3,5-s-triazine, tris-(2,2,6,6-tetramethyl-4-piperidyl) nitrilotriacetate, tetrakis-(2,2,6,6-tetramethyl-4-piperidyl)-1,2,3,4-butane tetraoate, 1,1'-(1,2-ethandiyl)bis(3,3,5,5-tetramethyl-piperazinone), 4-benzoyl-2,2,6,6-tetramethylpiperidine, 4-stearyloxy-2,2,6,6-tetramethylpiperidine, bis-(1,2,2,6,6-pentamethylpiperidyl) 2-n-butyl-2-(2-hydroxy-3,5-di-tert-butylbenzyl)malonate, 3-n-octyl-7,7,9,9-tetramethyl-1,3,8-triazaspiro-[4.5]decane-2,4-dione, bis-(1-octyloxy-2,2,6,6-tetramethylpiperidyl) sebacate, bis-(1-octyloxy-2,2,6,6-tetramethylpiperidyl) succinate, condensation product of N,N'-bis-(2,2,6,6-tetra-methyl-4-piperidyl) hexamethylenediamine and 4-morpholino-2,6-dichloro-1,3,5-triazine, condensation product of 2-chloro-4,6-di-(4-n-butylamino-2,2,6,6-tetramethylpiperidyl)-1,3,5-triazine and 1,2-bis-(3-aminopropyl-amino)ethane, condensation product of 2-chloro-4,6-di-(4-n-butylamino-1,2,2,6,6-pentamethylpiperidyl)-1,3,5-triazine and 1,2-bis-(3-amino propylamino)-ethane, 8-acetyl-3-dodecyl-7,7,9,9-tetramethyl-1,3,8-triazaspiro[4.5]decane-2,4-dione, 3-dodecyl-1-(2,2,6,6-tetramethyl-4-piperidyl) pyrrolidine-2,5-dione and 3-dodecyl-1-(1,2,2,6,6-pentamethyl-4-piperidyi)-pyrrolidine-2,5-dione.

6. Oxalamides, for example 4,4'-dioctyloxyoxanilide, 2,2'-diethoxyoxanilide, 2,2'-dioctyloxy-5,5'-di-tert-butyloxanilide, 2,2'-didodecyloxy-5,5'di-tert-butyloxanilide, 2-ethoxy-2'-ethyl-oxanilide, N,N'-bis-(3-dimethylaminopropyl)oxalamide, 2-ethoxy-5-tert-butyl-2'-ethyloxanilide and its mixture with 2-ethoxy-2'-ethyl-5,4'-di-tert-butyloxanilide, mixtures of o- and p-methoxy- and of o- and p-ethoxy-disubstituted oxanalides.

7. 2-(2-Hydroxyphenyl)-1,3,5-triazines, for example 2,4,6-tris(2-hydroxy-4-octyloxyphenyl)-1,3,5-triazine, 2-(2-hydroxy-4-octyloxyphenyl)-4,6-bis-(2,4-dimethylphenyl)-1,3,5-triazine, 2-(2,4-dihydroxyphenyl)-4,6-bis(2,4-dimethylphenyl)-1,3,5-triazine, 2,4-bis(2-hydroxy-4-propyl-oxy-phenyl)-6-(2,4-dimethylphenyl)-1,3,5-triazine, 2-(2-hydroxy-4-octyloxyphenyl)-4,6-bis(4-methylphenyl)-1,3,5-triazine, 2-(2-hydroxy-4-dodecyloxyphenyl)-4,6-bis(2,4-dimethylphenyl)-1,3,5-triazine, 2-[2-hydroxy-4-(2-hydroxy-3-butyloxy-propyloxy)phenyl]-4,6-bis(2,4-dimethylphenyl)-1,3,5-triazine, 2-[2-hydroxy-4-(2-hydroxy-3-octyloxy-propyloxy)phenyl]-4,6-bis(2,4-dimethylphenyl)-1,3,5-triazine, 2-[4-dodecyl/tridecyl-oxy-(2-hydroxypropyl)oxy-2-hydroxy-phenyl]-4,6-bis(2,4-dimethylphenyl)-1,3,5-triazine.

8. Phosphites and phosphonites, for example triphenyl phosphite, diphenyl alkyl phosphites, phenyl dialkyl phosphites, tris(nonylphenyl) phosphite, trilauryl phosphite, trioctadecyl phosphite, distearyl pentaerythrityl diphosphite, tris-(2,4-di-tert-butylphenyl) phosphite, diisodecyl pentaerythrityl diphosphite, bis-(2,4-di-tert-butylphenyl) pentaerythrityl diphosphite, bis-(2,6-di-tert-butyl-4-methylphenyl)pentaerythrityl diphosphite, bis-isodecyloxy pentaerythrityl diphosphite, bis-(2,4-di-tert-butyl-6-methylphenyl) pentaerythrityl diphosphite, bis-(2,4,6-tri-tert-butylphenyl)pentaerythrityl diphosphite, tristearyl sorbityl triphosphite, tetrakis-(2,4-di-tert-butylphenyl)-4,4'-biphenylene diphosphonite, 6-isooctyloxy-2,4,8,10-tetra-tert-butyl-12H-dibenzo[d,g]-1,3,2-dioxaphosphocine, 6-fluoro-2,4,8,10-tetra-tert-butyl-12-methyl-dibenzo [d,g]-1,3,2-dioxaphosphocine, bis-(2,4-di-tert-butyl-6-methylphenyl) methyl phosphite and bis(2,4-di-tert-butyl-6-methylphenyl) ethyl phosphite.

Further additives known in the art may be added as component (F), as for example antistatics, flow improvers, adhesion promoters, thickeners, antifoaming agents, flow control agents and leveling agents.

In the photosensitive thermosetting resin composition of the present invention, for improving charasteristics such as adhesion property, hardness, etc., if necessary, there may be used an inorganic filler such as for example barium sulfate, barium titanate, silicon oxide powder, particulate silicone oxide, amorphous silica, talc, clay, magnesium carbonate, calcium carbonate, aluminium oxide, aluminium hydroxide, mica powder, etc. The ration of the filler in the formulation is 0 to 60% by weight, preferably 5 to 40% by weight of the photosensitive thermosetting resin composition.

Further, if, necessary, there may be used known additives such as a known coloring agents, e.g. Phthalocynine Blue, Phthalocyanine Green, Diazo Yellow, Crystal Violet, titanium oxide, carbone black, naphthalene black, etc.

The composition optionally additionally comprises as component (F) epoxy curing promoters such as, for example, an amine compound, an imidazole compound, a carboxylic acid, a phenol, a quaternary ammonium salt, or a methylol group-containing compound. The amount of said curing agent to be used is in the range of 0 to 10% by weight, preferably 0.05 to 5% by weight, of the photosensitive thermosetting resin composition.

Accordingly, subject of the invention are compositions as described above, comprising further additives (F), which are selected from the group consisting of inorganic fillers, colourants, epoxy curing agents, thermal polymerization inhibitors, thickeners, antifoaming agents and leveling agents, in particular inorganic fillers.

To accelerate the photopolymerization it is possible to add amines, for example triethanolamine, N-methyldiethanolamine, p-dimethylaminobenzoate or Michler's ketone. The action of the amines can be intensified by the addition of aromatic ketones of the benzophenone type. Examples of amines which can be used as oxygen scavengers are substituted N,N-dialkylanilines, as are described in EP 339841. Other accelerators, coinitiators and autoxidizers are thiols, thioethers, disulfides, phosphonium salts, phosphine oxides or phosphines, as described, for example, in EP 438123, in GB 2180358 and in JP Kokai Hei 6-68309.

It is further possible to add chain transfer agents which are customary in the art to the compositions according to the invention. Examples are mercaptans, amines and benzothiazol.

The curing process can be assisted by, in particular, compositions which are pigmented (for example with titanium dioxide), and also by adding a component which under thermal conditions forms free radicals, for example an azo compound such as 2,2'-azobis(4-methoxy-2,4-dimethylvaleronitrile), a triazene, diazo sulfide, pentazadiene or a peroxy compound, for instance a hydroperoxide or peroxycarbonate, for example t-butyl hydroperoxide, as described for example in EP 245639.

The compositions according to the invention may comprise as further additive (F) a photoreducable dye, e.g., xanthene-, benzoxanthene-, benzothioxanthene, thiazine-, pyronine-, porphyrine- or acridine dyes, and/or trihalogenmethyl compounds which can be cleaved by irradiation. Similar compositions are for example described in EP 445624.

Further customary additives (F), depending on the intended use, are optical brighteners, wetting agents or levelling assistants.

In order to cure thick and pigmented coatings it is appropriate to add glass microspheres or pulverized glass fibres, as described for example in U.S. Pat. No. 5,013,768.

The choice of additive(s) (F) is made depending on the field of application and on properties required for this field. The additives described above are customary in the art and accordingly are added in amounts which are usual in the respective application.

In certain cases it may be of advantage to use mixtures of two or more of the o-acyloxim photoinitiators. It is of course also possible to use mixtures with known photoinitiators (B1), for example mixtures with camphor quinone, benzophenone, benzophenone derivatives, acetophenone, acetophenone derivatives, for example α-hydroxycycloalkyl phenyl ketones or 2-hydroxy-2-methyl-1-phenyl-propanone, dialkoxyacetophenones, α-hydroxy- or α-amino-acetophenones, e.g. (4-methylthiobenzoyl)-1-methyl-1-morpholinoethane, (4-morpholinobenzoyl)-1-benzyl-1-dimethylaminopropane, 4-aroyl-1,3-dioxolanes, benzoin alkyl ethers and benzil ketals, e.g. dimethyl benzil ketal, phenylglyoxalic esters and derivatives thereof, dimeric phenylglyoxalic esters, monoacyl phosphine oxides, e.g. (2,4,6-trimethylbenzoyl)diphenylphosphine oxide, bisacylphosphine oxides, bis(2,6-dimethoxy-benzoyl)-(2,4,4-trimethyl-pentyl)phosphine oxide, bis(2,4,6-trimethylbenzoyl)-phenylphosphine oxide, bis(2,4,6-trimethylbenzoyl)-2,4-dipentoxyphenylphosphine oxide, trisacylphosphine oxides, ferrocenium compounds, or titanocenes, e.g. bis(cyclopentadienyl)-bis(2,6-difluoro-3-pyrrylphenyl)titanium.

Where the o-acyloxime photoinitiators are employed in hybrid systems, use may be made, in addition to the free-radical hardeners, of cationic photoinitiators, for example peroxide compounds, such as benzoyl peroxide (other suitable peroxides are described in U.S. Pat. No. 4,950,581 column 19, lines 17–25), aromatic sulfonium-, phosphonium- or iodonium salts as described for example in U.S. Pat. No. 4,950,581, column 18, line 60 to column 19, line 10 or cyclopentadienyl-arene-iron(II) complex salts, for example ($\eta^6$-iso-propylbenzene)($\eta^5$-cyclopentadienyl)iron (II) hexafluorophosphate, as well as oxime sulfonic acid esters, as are, for example described in EP 780729.

Subject of the invention therefore also is a composition comprising additionally at least one photoinitiator (B1).

The photoinitiator (B) usually is added in an amount of 0.015 to 60 parts by weight, preferably 0.03 to 30 parts by weight, based on 100 parts by weight of component (A).

The amount refers to the sum of all photoinitiators added, if mixtures of initiators are employed. Accordingly, the amount either refers to the photoinitiator (B) or the photoinitiators (B)+(B1).

The invention also pertains to compositions comprising 100 parts by weight of component (A), 0.015 to 60 parts by weight of component (B), 5 to 300 parts by weight of component (C), 10 to 150 parts by weight of component (D) and 0.015 to 60 parts by weight of component (E).

The novel radiation-sensitive compositions find application as negative resists, having a very high sensitivity to light and being able to be developed in an aqueous alkaline medium without swelling. They are suitable as photoresists for electronics (electroless plating resist, electroplating resist, etch resist, solder resist).

The composition is applied uniformly to a substrate by means of known coating techniques, for example by spin coating, dip coating, knife coating, curtain coating, screen coating, brushing, spraying, especially by electrostatic spraying, and reverse-roll coating, and also by means of electrophoretic deposition. It is also possible to apply the photosensitive layer to a temporary, flexible support and then to coat the final substrate, for example a copper-clad circuit board, by transferring the layer via lamination.

The quantity applied (coat thickness) and the nature of the substrate (layer support) are dependent on the desired field of application. The range of coat thicknesses generally comprises values from about 0.1 $\mu$m to more than 100 $\mu$m, for example 0.1 $\mu$m to 1 cm, preferably 1 $\mu$m to 1000 $\mu$m.

Following the coating of the substrates, the solvent is removed, generally by drying, to leave a coat of the photoresist on the substrate.

Subject of the invention also is a solder resist comprising a composition as described above.

The term "imagewise" exposure includes both, exposure through a photomask comprising a predetermined pattern, for example a slide, as well as exposure by means of a laser or light beam, which for example is moved under computer control over the surface of the coated substrate and in this way produces an image, and irradiation with computer-controlled electron beams. It is also possible to use masks made of liquid crystals that can be adressed pixel by pixel to generate digital images, as is, for example, described by A. Bertsch, J. Y. Jezequel, J. C. Andre in Journal of Photochemistry and Photobiology A: Chemistry 1997, 107, p. 275–281 and by K.-P. Nicolay in Offset Printing 1997, 6, p. 34–37.

As already mentioned, the compositions can be developed by aqueous alkalis. Particularly suitable aqueous-alkaline developer solutions are aqueous solutions of tetraalkylammonium hydroxides or of alkali metal silicates, phosphates, hydroxides and carbonates. Minor quantities of wetting agents and/or organic solvents may also be added, if desired, to these solutions. Examples of typical organic solvents, which may be added to the developer liquids in small quantities, are cyclohexanone, 2-ethoxyethanol, toluene, acetone and mixtures of such solvents.

The photosensitivity of the novel compositions can extend in general from about 200 nm to 600 nm (UV-vis region). Suitable radiation is present, for example, in sunlight or light from artificial light sources. Consequently, a large number of very different types of light sources are employed. Both point sources and arrays ("lamp carpets") are suitable. Examples are carbon arc lamps, xenon arc lamps, medium-, high- and low-pressure mercury lamps, possibly with metal halide dopes (metal-halogen lamps), microwave-stimulated metal vapour lamps, excimer lamps, superactinic fluorescent tubes, fluorescent lamps, argon incandescent lamps, electronic flashlights, photographic flood lamps, light emitting diodes (LED), electron beams and X-rays. The distance between the lamp and the substrate to be exposed in accordance with the invention may vary depending on the intended application and the type and output of lamp, and may be, for example, from 2 cm to 150 cm. Laser light sources, for example excimer lasers, such as krypton F lasers for exposure at 248 nm are also suitable. Lasers in the visible region can also be employed. By this method it is possible to produce printed circuits in the electronics industry, lithographic offset printing plates or relief printing plates, and also photographic image recording materials.

The invention therefore also provides a process for the photopolymerization of compounds containing at least one ethylenically unsaturated double bond, which comprises adding to the abovementioned compounds at least one photoinitiator of formula I, II, III, IV, V or VI as described above and irradiating the resulting composition with electromagnetic radiation, in particular light of the wavelenghth 190 to 600 nm, namely a process for the photopolymerization of compounds containing ethylenically unsaturated double bonds, which comprises irradiating a composition as described above with electromagnetic radiation in the range from 190 to 600 nm, electron beam or X-rays.

The invention also pertains to a coated substrate which is coated on at least one surface with a composition as described above, as well as to a process for the photographic production of relief images, in which said coated substrate is subjected to imagewise exposure and then the unexposed portions are removed with a solvent.

Especially preferred is the use of the compositions according to the invention in an image-forming process, e.g. a process for the preparation of solder masks, wherein (1) the components of the composition as described above are mixed
(2) the resulting composition is applied to the substrate ("coating of the substrate")
(3) the solvent, if present, is evaporated, e.g. at a temperature between 80–90° C.
(4) the coated substrate is exposed to irradiation through a negative mask (thereby initiating the reaction of the acrylate)
(5) the irradiated sample is developed, by washing with aqueous alkaline solution and thereby removing the uncured areas and
(6) the sample is thermally cured, e.g. at a temperature about 150° C., thereby initiating the crosslinking between the carboxylic acid and the epoxy component. This process is another object of the invention.

The compositions of the invention have a high sensitivity and resolution even at low concentration of the photoinitiator, with or without a sensitizer and are particularly suitable in aqueous developable photoresist applications. They have a good thermal stability and low volatility.

The examples which follow illustrate the invention in more detail. Parts and percentages are, as in the remainder of the description and in the claims, by weight, unless stated otherwise. Where alkyl radicals having more than three carbon atoms are referred to without any mention of specific isomers, the n-isomers are meant in each case.

The following oxime ester photoinitiators are used in the examples:

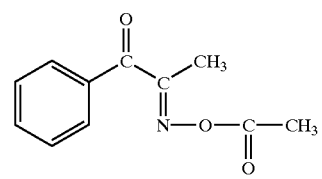

1

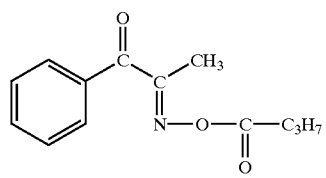

2

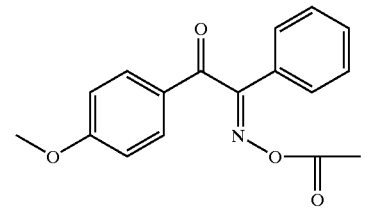

3

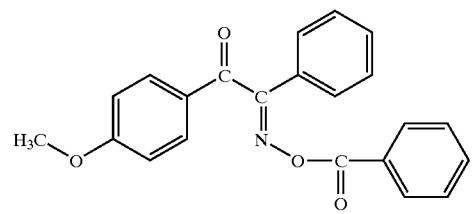

4

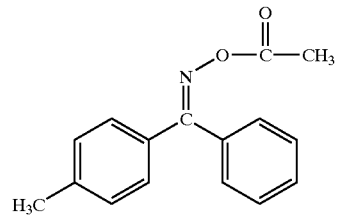

5

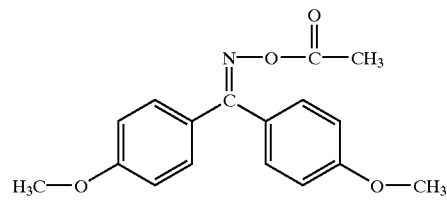

6

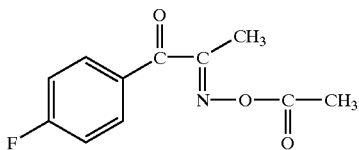

The following sensitzer compounds are used in the examples:

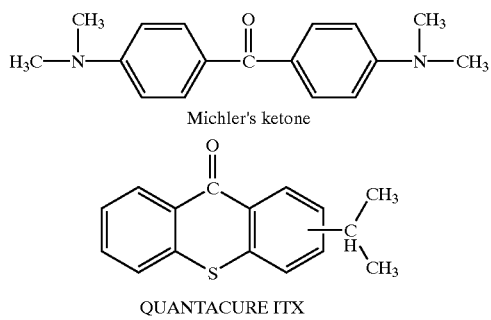

Michler's ketone

QUANTACURE ITX

EXAMPLE 1

Two photocurable formulations for a sensitivity test are prepared by mixing the following components:

A 200.0 parts by weight of acrylated acrylcopolymer (ACA200M, provided by Daicel Industries, Ltd.)
15.0 parts by weight of dipentaerythritol hexaacrylate ((DPHA), provided by UCB Chemicals),
45.0 parts by weight of phenolnovolak epoxy (GY1180, provided by Ciba Specialty Chemicals)
3.2 parts by weight of photoinitiator

B 153.0 parts by weight of tris-phenolmethane epoxyacrylate modified with acid anhydride (TCR1025, provided by Nippon Kayaku Co., Ltd.)
15.0 parts by weight of dipentaerythritol hexaacrylate ((DPHA), provided by UCB Chemicals),
45.0 parts by weight of phenolnovolak epoxy (GY1180, provided by Ciba Specialty Chemicals)
3.2 parts by weight of photoinitiator

C 142.9 parts by weight of novolak epoxyacrylate modified with acid anhydride (NEOPOL8319, provided by U-Pica)
15.0 parts by weight of dipentaerythritol hexaacrylate ((DPHA), provided by UCB Chemicals),
45.0 parts by weight of phenolnovolak epoxy (GY1180, provided by Ciba Specialty Chemicals)
3.2 parts by weight of photoinitiator All operations are carried out under yellow light. The formulations are applied to an aluminum plate. The solvent is removed by heating at 80 C.° for 15 minutes in a convection oven. The thickness of the dry film is 25 µm. To this coating an acetate film is applied, over which a standardized test negative with 21 steps of different optical density (Stouffer step wedge) is placed. The sample is covered with a second UV-transparent film and pressed onto a metal plate by means of vacuum. Exposure is carried out in a first test series for 40 seconds, in a second series for 80 seconds and in a third series for 160 seconds, using a 3 kW metal halide lamp (ORC, model SMX 3000) at a distance of 60 cm. Following exposure, the cover films and the mask are removed and the exposed film is developed with 1% sodium carbonate aqueous solution for 180 sec. at 30° C. by using a spray type developer (Walter Lemmen, model T21). The sensitivity of the initiator system used is characterized by indicating the highest step number which remained (i.e. polymerized) after developing. The higher the number of steps, the more sensitive is the system tested.

With some acyl oxime photoinitiators a further test series is provided, adding 0.32 part by weight of a mixture of 2-isopropylthioxanthone and 4-isopropylthioxanthone (®QUANTACURE ITX, International Biosynthetics) or adding 0.07 part by weight of Michier's ketone to the above described formulation. The results are collected in tables 1 and 2.

Table 1 Sensitivity Results of Composition A

| | | Number of steps reproduced after exposure time of | | |
|---|---|---|---|---|
| Photoinitiator | Sensitizer | 40 sec. | 80 sec. | 160 sec. |
| 1 | — | 6 | 8 | 11 |
| 1 | Quantacure ITX | 8 | 11 | 14 |
| 1 | Michler's ketone | 7 | 10 | 13 |
| 3 | Quantacure ITX | 9 | 11 | 14 |
| 3 | Michler's ketone | 7 | 9 | 12 |
| 6 | Quantacure ITX | 8 | 10 | 13 |
| 7 | — | 6 | 8 | 11 |
| 7 | Quantacure ITX | 8 | 11 | 14 |
| 7 | Michler's ketone | 7 | 10 | 13 |

TABLE 2

Sensitivity results of composition B

| | | Number of steps reproduced after exposure time of | | |
|---|---|---|---|---|
| Photoinitiator | Sensitizer | 40 sec. | 80 sec. | 160 sec. |
| 1 | — | 6 | 8 | 10 |
| 1 | Quantacure ITX | 9 | 11 | 13 |
| 3 | Quantacure ITX | 10 | 12 | 14 |
| 5 | Quantacure ITX | 9 | 11 | 13 |

TABLE 3

Sensitivity results of composition C

| | | Number of steps reproduced after exposure time of | | |
|---|---|---|---|---|
| Photoinitiator | Sensitizer | 40 sec. | 80 sec. | 160 sec. |
| 1 | Quantacure ITX | 7 | 10 | 12 |
| 3 | Quantacure ITX | 10 | 12 | 14 |
| 3 | Michler's ketone | 7 | 9 | 12 |
| 5 | Quantacure ITX | 9 | 11 | 13 |
| 6 | Quantacure ITX | 9 | 11 | 13 |

TABLE 3-continued

Sensitivity results of composition C

| Photoinitiator | Sensitizer | Number of steps reproduced after exposure time of | | |
|---|---|---|---|---|
| | | 40 sec. | 80 sec. | 160 sec. |
| 6 | Michler's ketone | 6 | 9 | 11 |
| 7 | Quantacure ITX | 8 | 10 | 12 |

EXAMPLE 2

A photocurable formulation for a developability test is prepared by mixing the following components:

153.0 parts by weight of tris-phenolmethane epoxyacrylate modified with acid anhydride (TCR1025, provided by Nippon Kayaku Co., Ltd.)

15.0 parts by weight of dipentaerythritol hexaacrylate ((DPHA), provided by UCB Chemicals), 45.0 parts by weight of phenolnovolak epoxy (GY1180, provided by Ciba Specialty Chemicals), 15.0 parts by weight of a photoinitiator compound (compounds 1, 2, 3, 4, 5, 6, 7)

All operations are carried out under yellow light. The formulations are applied to an aluminum plate. The thickness of the dry film is 25 μm. The coatings are heated at 100° C. for 40, 50 or 60 minutes. Following thermal treatment, the film is developed with 1% sodium carbonate aqueous solution for 180 sec. at 30° C. by using a spray type developer (Walter Lemmen, model T21).

With all tested oxime photoinitiator compounds, namely compounds 1–7, compositions being completely developable and without undeveloped remains are achieved.

What is claimed is:

1. Photosensitive thermosetting liquid composition comprising (A) an oligomer or polymer containing at least one carboxylic acid group in the molecule;

(B) at least one compound of the formula I, II, III, IV, V or VI

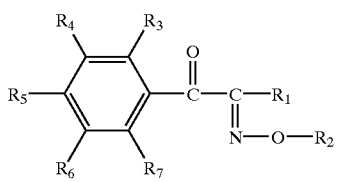

(I)

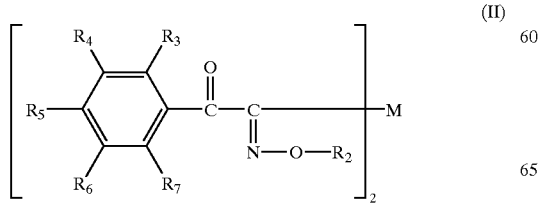

(II)

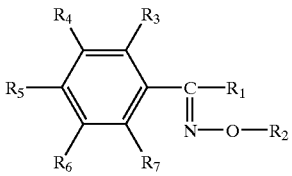

(III)

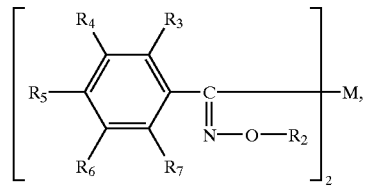

(IV)

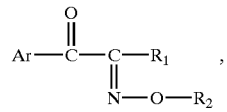

(V)

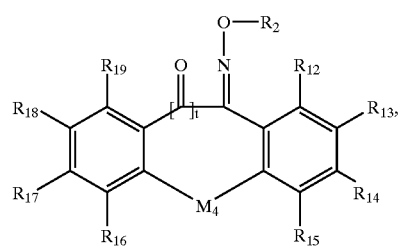

(VI)

wherein $R_1$ is phenyl which is unsubstituted or substituted by one or more $C_1$–$C_6$alkyl, phenyl, halogen, $OR_8$, $SR_9$ or $NR_{10}R_{11}$, or $R_1$ is $C_1$–$C_{20}$alkyl, $C_2$–$C_{20}$alkenyl, $C_2$–$C_{20}$alkynyl or $C_2$–$C_{20}$alkyl optionally be interrupted by one or more —O— and/or optionally substituted by one or more hydroxyl groups, or $R_1$ is $C_2$–$C_{20}$alkanoyl or benzoyl which is unsubstituted or substituted by one or more $C_1$–$C_6$alkyl, phenyl, $OR_8$, $SR_9$ or $NR_{10}R_{11}$, or $R_1$ is $C_2$–$C_{12}$alkoxycarbonyl optionally interrupted by one or more —O— and/or optionally substituted by one or more hydroxyl groups, or $R_1$ is phenoxycarbonyl which is unsubstituted or substituted by $C_1$–$C_6$alkyl, halogen, phenyl, $OR_8$ or $NR_{10}R_{11}$, or $R_1$ is —$CONR_{10}R_{11}$, CN, $NO_2$, $C_1$–$C_4$haloalkyl, $S(O)_mC_1$–$C_6$alkyl, unsubstituted or $C_1$–$C_{12}$alkyl-substituted $S(O)_m$—$C_6$–$C_{12}$aryl, $SO_2O$—$C_1$–$C_6$alkyl, $SO_2O$—$C_6$–$C_{10}$aryl, or diphenylphosphinoyl, or $R_1$ together with $R_3$ or $R_1$ together with $R_7$ may form 5 or 6 membered rings including one or more CO— and/or oxime-groups;

m is 1 or 2;

$R_2$ is $C_2$–$C_{12}$alkanoyl which is unsubstituted or substituted by one or more halogen or CN, or $R_2$ is $C_3$–$C_{12}$alkenoyl, or benzoyl which is unsubstituted or substituted by one or more $C_1$–$C_6$alkyl, phenyl, halogen CN, $OR_8$, $SR_9$ or $NR_{10}R_{11}$, or $R_2$ is $C_2$–$C_{12}$alkoxycarbonyl or phenoxycarbonyl which is unsubstituted or substituted by $C_1$–$C_6$alkyl or halogen;

$R_3$, $R_4$, $R_5$, $R_6$ and $R_7$ independently of one another are hydrogen, halogen, $C_1$–$C_{12}$alkyl, cyclopentyl, cyclohexyl or phenyl which is unsubstituted or substituted by one or more $OR_8$, $SR_9$ or $NR_{10}R_{11}$, or $R_3$, $R_4$, $R_5$, $R_6$ and $R_7$ are benzyl, benzoyl, $C_2$–$C_{12}$alkanoyl, $C_2$–$C_{12}$alkoxycarbonyl optionally interrupted by one or more —O— and/or optionally substituted by one or more hydroxyl groups or $R_3$, $R_4$, $R_5$, $R_6$ and $R_7$ are phenoxycarbonyl or a group $OR_8$, $SR_9$, $SOR_9$, $SO_2R_9$, $NO_2$, CN, $CONR_{10}R_{11}$, or $NR_{10}R_{11}$, wherein the substituents $OR_8$, $SR_9$ and $NR_{10}R_{11}$ may form 5- or 6-membered rings via the radicals $R_8$, $R_9$, $R_{10}$ and/or $R_{11}$ with further substituents on the phenyl ring or with one of the carbon atoms of the phenyl ring;

$R_8$ is hydrogen, $C_1$–$C_{12}$alkyl or $C_2$–$C_6$alkyl which is substituted by —OH, —SH, —CN, $C_1$–$C_4$alkoxy, $C_3$–$C_6$alkenoxy, —OCH$_2$CH$_2$CN, —OCH$_2$CH$_2$COO($C_1$—$C_4$alkyl), —OCO—$C_1$–$C_4$alkyl, —OCO-phenyl, COOH or COO($C_1$–$C_4$alkyl), or $R_8$ is $C_2$–$C_6$alkyl which is interrupted by one or more —O—, or $R_8$ is —(CH$_2$CH$_2$O)$_n$H, $C_2$–$C_8$alkanoyl, $C_2$–$C_{12}$alkenyl, $C_3$–$C_6$alkenoyl, cyclohexyl or phenyl which is unsubstituted or substituted by halogen, $C_1$–$C_{12}$alkyl or $C_1$–$C_4$alkoxy, or $R_8$ is phenyl-$C_1$–$C_3$alkyl or Si($C_1$–$C_8$alkyl)$_r$(phenyl)$_{3-r}$ or $R_8$ is a group

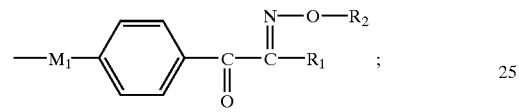

n is 1–20;
r is 1, 2 or 3;

$R_9$ is hydrogen, $C_1$–$C_{12}$alkyl, $C_2$–$C_{12}$alkenyl, cyclohexyl, $C_2$–$C_6$alkyl which is substituted by —OH, —SH, —CN, $C_1$–$C_4$alkoxy, $C_3$–$C_6$alkenoxy, —OCH$_2$CH$_2$CN, —OCH$_2$CH$_2$COO($C_1$–$C_4$alkyl), —OCO—$C_1$–$C_4$alkyl, —OCO-phenyl, COOH or COO($C_1$–$C_4$alkyl) or $R_9$ is $C_2$–$C_{12}$alkyl which is interrupted by one or more —O— or —S— or $R_9$ is phenyl which is unsubstituted or substituted by halogen, $C_1$–$C_{12}$alkyl or $C_1$–$C_4$alkoxy, or $R_9$ is phenyl-$C_1$–$C_3$alkyl or a group

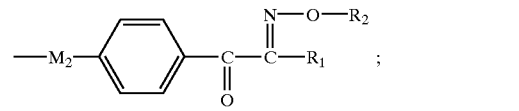

$R_{10}$ and $R_{11}$ independently of each other are hydrogen, $C_1$–$C_{12}$alkyl, $C_2$–$C_4$hydroxyalkyl, $C_2$–$C_{10}$alkoxyalkyl, $C_2$–$C_5$alkenyl, $C_5$–$C_{12}$cycloalkyl, phenyl-$C_1$–$C_3$alkyl, phenyl which is unsubstituted or substituted by $C_1$–$C_{12}$alkyl or $C_1$–$C_4$alkoxy, or $R_{10}$ and $R_{11}$ are $C_2$–$C_3$alkanoyl, $C_3$–$C_6$alkenoyl or benzoyl, or $R_{10}$ and $R_{11}$ together are $C_2$–$C_6$alkylene optionally interrupted by —O— or —NR$_8$—, or $R_{10}$ and $R_{11}$ together are $C_2$–$C_6$alkylene which can be substituted by hydroxyl, $C_1$–$C_4$alkoxy, $C_2$–$C_4$alkanoyloxy or benzoyloxy, or, when $R_{10}$ is hydrogen, $R_{11}$ may be a group

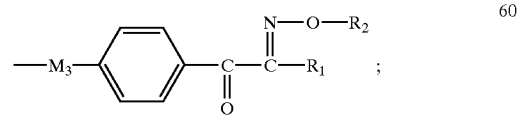

$R_{12}$, $R_{13}$, $R_{14}$, $R_{15}$, $R_{16}$, $R_{17}$, $R_{18}$ and $R_{19}$ independently of one another are hydrogen, halogen, $C_1$–$C_{12}$alkyl, cyclopentyl, cyclohexyl or phenyl which is unsubstituted or substituted by one or more $OR_8$, $SR_9$ or $NR_{10}R_{11}$, or $R_{12}$, $R_{13}$, $R_{14}$, $R_{15}$, $R_{16}$, $R_{17}$, $R_{18}$ and $R_{19}$ are benzyl, benzoyl, $C_2$–$C_{12}$alkanoyl, $C_2$–$C_{12}$alkoxycarbonyl optionally interrupted by one or more —O— and/or optionally substituted by one or more hydroxyl groups or $R_{12}$, $R_{13}$, $R_{14}$, $R_{15}$, $R_{16}$, $R_{17}$, $R_{18}$ and $R_{19}$ are phenoxycarbonyl or a group $OR_8$, $SR_9$, $SOR_9$, $SO_2R_9$, $NO_2$, CN, $CONR_{10}R_{11}$, or $NR_{10}R_{11}$, wherein the substituents $OR_8$, $SR_9$ and $NR_{10}R_{11}$ may form 5- or 6-membered rings via the radicals $R_8$, $R_9$, $R_{10}$ and/or $R_{11}$ with further substituents on the phenyl ring or with one of the carbon atoms of the phenyl ring or, when $M_4$ is a direct bond, $R_{15}$ and $R_{16}$ together are ethylene or ethynylene;

t is 0 or 1;

M is $C_1$–$C_{12}$alkylene, cyclohexylene, phenylene, —COO—($C_2$–$C_{12}$alkylene)—OOC—, —COO—(CH$_2$CH$_2$O)$_n$—OC— or —CO—($C_2$–$C_{12}$-alkylene)—CO—;

$M_1$ is a direct bond or $C_1$–$C_{12}$alkylenoxy, optionally interrupted by 1 to 5 —O—, —S— and/or —NR$_{10}$—;

$M_2$ is a direct bond or $C_1$–$C_{12}$-alkylene-S—, optionally interrupted by 1 to 5 —O—, —S— and/or —NR$_{10}$—;

$M_3$ is a direct bond, a piperazino group, or $C_1$–$C_{12}$alkylene-NR$_{10}$—, optionally interrupted by 1 to 5 —O—, —S— and/or —NR$_{10}$—;

$M_4$ is a direct bond, —O—, —S—, —SO—, —SO$_2$—, —CO—, —CH$_2$—, —NR$_{10}$—, or a group

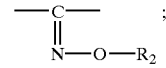

Ar is a 5- or 6-membered aromatic heterocyclic ring, which is unsubstituted or substituted by one or more $C_1$–$C_6$alkyl, phenyl, halogen, $OR_8$, $SR_9$, $NR_{10}R_{11}$, CN, $C_2$–$C_6$alkanoyl or benzoyl;

wherein 1-phenyl-1,2-propanedione-2-o-benzoyl oxime and 1-phenyl-1,2-propanedione-2-o-ethoxycarbonyl oxime are excluded;

(C) a photopolymerizable reactive or unreactive diluent; and (D) as a thermosetting component an epoxy compound containing at least two epoxy groups in one molecule.

2. A composition according to claim 1, wherein in the compound of formula I and III, $R_1$ is phenyl which is unsubstituted or substituted by one or more $C_1$–$C_6$alkyl, phenyl, halogen, $OR_8$, $SR_9$ or $NR_{10}R_{11}$, or $R_1$ is $C_6$–$C_{20}$alkyl or $C_2$–$C_{20}$alkyl optionally interrupted by one or more —O— and/or optionally substituted by one or more hydroxyl groups.

3. A composition according to claim 1, wherein the oligomer or polymer (A) contains at least two ethylenically unsaturated polymerizable groups.

4. A composition according to claim 1, wherein the oligomer or polymer (A) is a resin obtained by the reaction of a saturated or unsaturated polybasic acid anhydride with a product of the reaction of an epoxy compound and an unsaturated monocarboxylic acid, or is an addition product formed between a carboxyl group-containing resin and an unsaturated compound having an α,β-unsaturated double bond and an epoxy group.

5. A composition according to claim 1, comprising in addition to the components (A), (B), (C) and (D) at least one photosensitizer compound (E).

6. A composition according to claim 5, comprising 100 parts by weight of component (A), 0.015 to 60 parts by weight of component (B), 5 to 300 parts by weight of component (C), 10 to 150 parts by weight of component (D) and 0.015 to 60 parts by weight of component (E).

7. A composition according to claim 1, comprising further additives (F), which are selected from the group consisting of inorganic fillers, colourants, epoxy curing agents, thermal polymerization inhibitors, thickeners, antifoaming agents and leveling agents, in particular inorganic fillers.

8. Solder resist comprising a composition according to claim 1.

9. Process for the photopolymerization of compounds containing ethylenically unsaturated double bonds, which comprises irradiating a composition according to claim 1 with light in the range from 200 to 600 nm.

10. Coated substrate which is coated on at least one surface with a composition according to claim 1.

11. Process for the photographic production of relief images, in which a coated substrate according to claim 10 is subjected to imagewise exposure and then the unexposed portions are removed with a solvent.

12. Process for the preparation of solder masks, wherein
  (1) the components of a composition according to claim 1 are mixed;
  (2) the resulting composition is applied to a substrate;
  (3) the solvent, if present, is evaporated;
  (4) the coated substrate is exposed to irradiation through a negative mask;
  (5) the irradiated sample is developed by washing with aqueous alkaline solution; and
  (6) the sample is thermally cured.

* * * * *